US012418290B2

(12) United States Patent
Huang et al.

(10) Patent No.: US 12,418,290 B2
(45) Date of Patent: Sep. 16, 2025

(54) PROGRAMMABLE AND REPROGRAMMABLE QUANTUM CIRCUIT

(71) Applicant: International Business Machines Corporation, Armonk, NY (US)

(72) Inventors: Elbert Emin Huang, Mountain View, CA (US); Charles Thomas Rettner, San Jose, CA (US); Michael Justin Beckley, San Jose, CA (US); Russell A. Budd, North Salem, NY (US); Vivekananda P. Adiga, Ossining, NY (US); David C. Mckay, Ossining, NY (US); Sarah Elizabeth Sheldon, Tarrytown, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 18/354,469

(22) Filed: Jul. 18, 2023

(65) Prior Publication Data
US 2024/0372548 A1    Nov. 7, 2024

Related U.S. Application Data

(62) Division of application No. 17/133,996, filed on Dec. 24, 2020, now Pat. No. 11,750,189.

(51) Int. Cl.
*H03K 17/92* (2006.01)
*G06N 10/00* (2022.01)

(52) U.S. Cl.
CPC ............ *H03K 17/92* (2013.01); *G06N 10/00* (2019.01)

(58) Field of Classification Search
CPC ...................................................... H03K 17/92
USPC ....................................................... 327/525
See application file for complete search history.

(56) References Cited

U.S. PATENT DOCUMENTS

| | | | |
|---|---|---|---|
| 5,233,244 A | 8/1993 | Suzuki | |
| 5,811,869 A * | 9/1998 | Seyyedy | G11C 17/16 438/600 |
| 7,869,221 B2 | 1/2011 | Knight et al. | |
| 8,837,544 B2 | 9/2014 | Santori et al. | |
| 10,380,496 B2 | 8/2019 | Elsherbini et al. | |

(Continued)

FOREIGN PATENT DOCUMENTS

| | | |
|---|---|---|
| CN | 101283412 A | 10/2008 |
| CN | 103766006 A | 4/2014 |

(Continued)

OTHER PUBLICATIONS

International Search Report and Written Opinion received for PCT Application Serial No. PCT/EP2021/087189 dated Apr. 14, 2022, 15 pages.

(Continued)

*Primary Examiner* — Tomi Skibinski
(74) *Attorney, Agent, or Firm* — Amin, Turocy & Watson, LLP

(57) ABSTRACT

Devices and/or computer-implemented methods to facilitate a programmable and/or reprogrammable quantum circuit are provided. According to an embodiment, a device can comprise a superconducting coupler device having a superconducting fuse device that is used to alter the coupling of a first quantum computing element and a second quantum computing element.

18 Claims, 16 Drawing Sheets

(56) References Cited

U.S. PATENT DOCUMENTS

| | | | |
|---|---|---|---|
| 10,381,541 | B2 | 8/2019 | Das et al. |
| 2007/0081406 | A1 | 4/2007 | Boerstler et al. |
| 2009/0134909 | A1* | 5/2009 | Madurawe .......... H01L 27/1203 326/38 |
| 2013/0009571 | A1 | 1/2013 | Antaya |
| 2015/0279479 | A1 | 10/2015 | Li et al. |
| 2019/0109273 | A1 | 4/2019 | Abraham et al. |
| 2020/0177399 | A1 | 6/2020 | Speed et al. |
| 2023/0029063 | A1 | 1/2023 | Prez et al. |

FOREIGN PATENT DOCUMENTS

| | | |
|---|---|---|
| CN | 106133839 A | 11/2016 |
| EP | 0 506 345 A2 | 9/1992 |
| ES | 2752086 A1 | 4/2020 |
| WO | 2012/170345 A1 | 12/2012 |

OTHER PUBLICATIONS

Rincon et al., "Reconfigurable Hardware Systems", 1998 International Semiconductor Conference, CAS'98 Proceedings, vol. 1, Oct. 6, 1998, doi: 10.1109/SMICND.1998.732274, pp. 45-54.

Devoret et al., "Implementing Qubits with Superconducting Integrated Circuits", Quantum Information Processing, vol. 3, Oct. 1, 2004, pp. 163-203.

Kaminsky et al., "Scalable Superconducting Architecture for Adiabatic Quantum Computation", arXiv:quant-ph/0403090v2, Mar. 12, 2004, 4 pages.

Non- Final Office Action received for U.S. Appl. No. 17/133,996, dated Jun. 6, 2022, 23 pages.

Final Office Action received for U.S. Appl. No. 17/133,996, dated Oct. 14, 2022, 16 pages.

Notice of Allowance received for U.S. Appl. No. 17/133,996, dated Apr. 10, 2023, 18 pages.

U.S. Appl. No. 17/097,430, filed Nov. 13, 2020.

U.S. Appl. No. 17/097,482, filed Nov. 13, 2020.

List of IBM Patents or Applications Treated as Related.

Examination Report No. 1 for Standard Patent Application for Australian Application Serial No. 2021405604 dated Sep. 5, 2023.

Response to the communication pursuant to R 161 (1) and R 162 EPC received for European Patent Application Serial No. 21844289.5 dated Jan. 10, 2024, 5 pages.

Japanese Patent Office "Notice of Reasons for Refusal" Janapese Patent Application No. 2023-534224, May 18, 2025, 3 pages.

Chinese Office Action in Chinese Application No. 202180086639.4 dated Jul. 17, 2025, with translation, 16 pages.

* cited by examiner

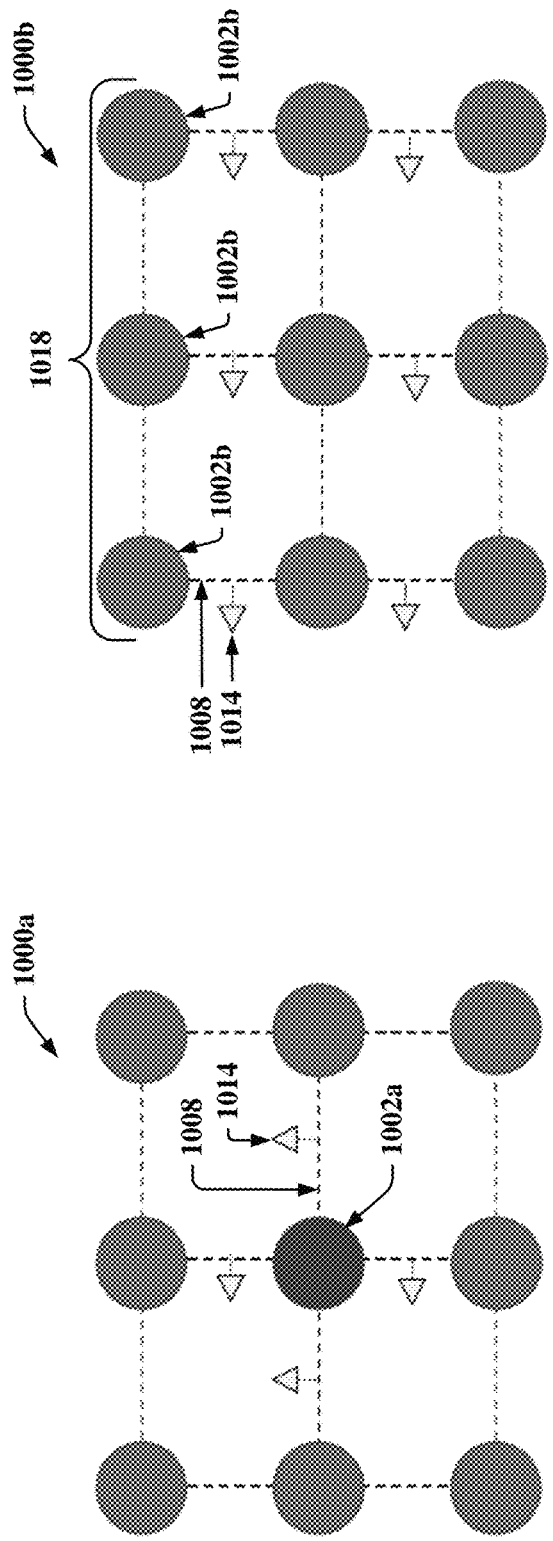
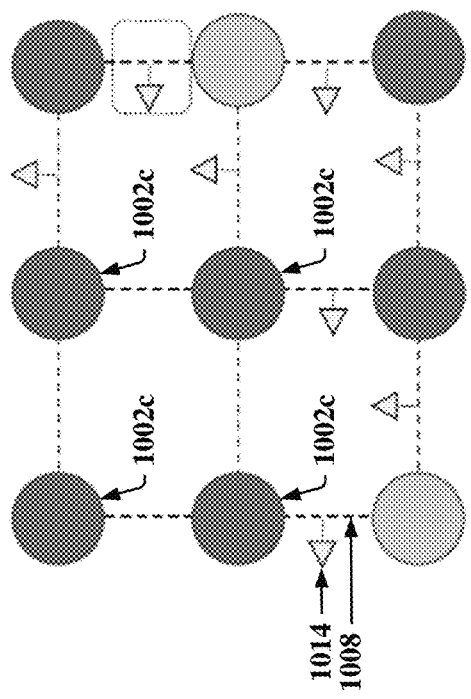
FIG. 10A
FIG. 10B
FIG. 10C

PROGRAMMABLE AND REPROGRAMMABLE QUANTUM CIRCUIT

BACKGROUND

The subject disclosure relates to a quantum circuit, and more specifically, to a programmable and reprogrammable quantum circuit.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate a programmable and/or reprogrammable quantum circuit are described.

According to an embodiment, a device can comprise a superconducting coupler device having a superconducting fuse device that is used to alter the coupling of a first quantum computing element and a second quantum computing element.

According to an embodiment, a device can comprise a superconducting coupler device having a superconducting antifuse device that is used to alter the coupling of a first quantum computing element and a second quantum computing element.

According to another embodiment, a computer-implemented method can comprise reconfiguring, by a system operatively coupled to a processor, connectivity of quantum computing elements based on exposure of one or more superconducting switch devices provided on one or more superconducting coupler devices to at least one laser output.

DESCRIPTION OF THE DRAWINGS

FIGS. 1, 2, 3, 4, 5, 6A, 6B, 7, 8, 9, 10A, 10B, 10C, 11, and 12 illustrate example, non-limiting devices that can facilitate a programmable and/or reprogrammable quantum circuit in accordance with one or more embodiments described herein.

DETAILED DESCRIPTION

Figure 1:
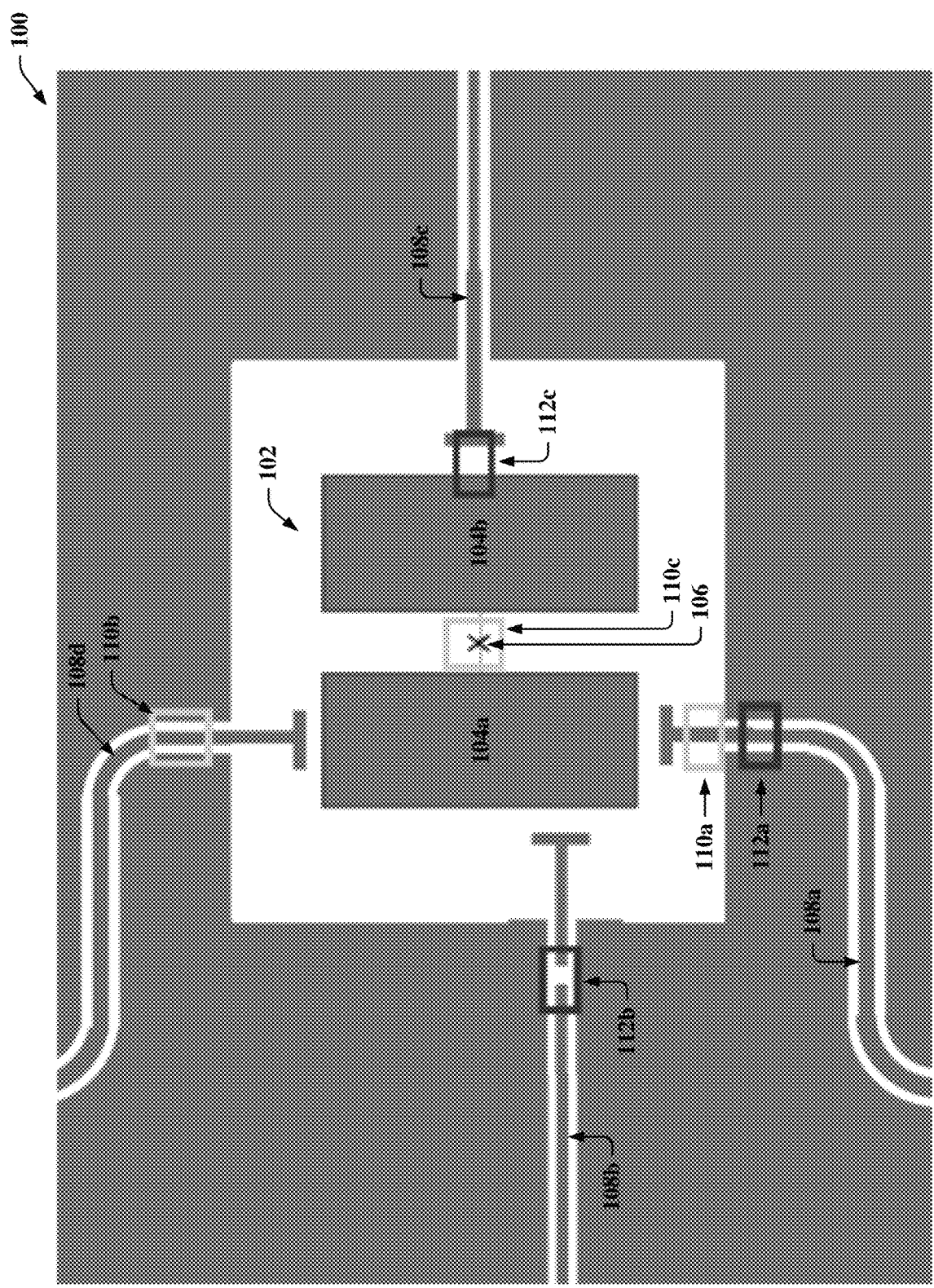

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, can entangle multiple quantum bits, and use interference.

Qubit yield and frequency collision are challenging problems for multiqubit devices and quantum computers. Qubits can exhibit a broad range in coherence and some qubits behave poorly. Multiqubit devices may be limited by the worst qubits. These issues are expected to be exacerbated as quantum computers are scaled to have more qubits. To overcome these issues, the various embodiments of the subject disclosure can facilitate programmable and/or reprogrammable quantum circuits (e.g., superconducting circuits comprising one or more qubits) by using one or more superconducting fuse devices and/or one or more superconducting antifuse devices to define a quantum circuit that satisfies certain criteria when implemented. For example, the various embodiments of the subject disclosure can enable removal of one or more problematic qubits from a quantum circuit, thereby facilitating a programmable and/or reprogrammable qubit circuit. For instance, the various embodiments of the subject disclosure can enable removal of a problematic qubit including, but not limited to, a malfunctioning qubit, a qubit exhibiting a poor quality factor (Q) related to its coherence, a qubit having a frequency that is off target, and/or another problematic qubit.

As reference herein, a "superconducting fuse device" (also referred to herein as a "fuse") can comprise a type of superconducting switch device that can provide an electrical connection that can be opened (e.g., to interrupt the flow of electrical current). As referenced herein, a "superconducting antifuse device" (also referred to herein as an "antifuse") can comprise another type of superconducting switch device that can be closed to provide an electrical connection (e.g., to enable electrical current to flow). As referenced herein, an "entity" can comprise a human, a client, a user, a computing device, a software application, an agent, a machine learning model, an artificial intelligence, and/or another entity. It should be appreciated that such an "entity" can facilitate the design, fabrication, and/or implementation (e.g., simulation, quantizing, and/or testing) of one or more embodiments of the subject disclosure described herein. It will be understood that when an element is referred to as being "coupled" to another element, it can describe one or more different types of coupling including, but not limited to, capacitive coupling, chemical coupling, communicative coupling, electrical coupling, electromagnetic coupling, inductive coupling, operative coupling, optical coupling, physical coupling, thermal coupling, and/or another type of coupling.

One or more embodiments are now described with reference to the drawings, where like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

FIG. 1 illustrates an example, non-limiting device 100 that can facilitate a programmable and/or reprogrammable quantum circuit in accordance with one or more embodiments described herein. Device 100 can comprise a semiconducting and/or a superconducting device that can be implemented in a quantum device. For example, device 100 can comprise an integrated semiconducting and/or superconducting circuit (e.g., a quantum circuit) that can be implemented in a quantum device such as, for instance, quantum hardware, a quantum processor, a quantum computer, and/or another quantum device. Device 100 can comprise a semiconducting and/or a superconducting device such as, for instance, a programmable and/or reprogrammable quantum circuit device that can be implemented in such a quantum device defined above.

In some embodiments, device 100 can comprise a programmable and/or reprogrammable quantum circuit device that can be integrated into a circuit (e.g., a quantum circuit, a superconducting circuit, and/or another circuit) and/or a processor (e.g., a quantum processor) by, for instance, using interconnects (e.g., microwave interconnects) including, but not limited to, wirebonds, bump bonds, mechanical interconnects (e.g., pogo pins), and/or another interconnect. In these embodiments, such interconnects (e.g., microwave interconnects) can couple (e.g., connect) device 100 to wiring layers comprising, for instance, printed circuit boards, laminate boards, flexible wiring, and/or coaxial cables. In these embodiments, such wiring layers can couple (e.g., connect) device 100 to other components (e.g., microwave components) such as, for example, directional couplers, attenuators, isolators, filters, amplifiers, and/or another component. In some embodiments, device 100 can be directly co-fabricated on the same chip as a quantum processor or other elements (e.g., microwave elements).

Fabrication of device 100 can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, device 100 can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (RIE), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

Device 100 can be fabricated using various materials. For example, device 100 can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

As illustrated in the example embodiment depicted in FIG. 1, device 100 can comprise a qubit 102. In various embodiments of the subject disclosure, qubit 102 can comprise a quantum computing element. As referenced herein, a "quantum computing element" can comprise, for example, a qubit, a qubit device, a quantum computing device, a readout device, a quantum resonator, a waveguide, a Josephson junction, a ground, a capacitor, a shunt capacitor, and/or another quantum computing element.

Qubit 102 can comprise capacitor pads 104a. 104b and a Josephson junction 106 (represented by an "X" in FIG. 1), where each of capacitor pads 104a, 104b are coupled to Josephson junction 106. Device 100 can further comprise one or more superconducting coupler devices 108a, 108b, 108c, 108d. In various embodiments of the subject disclosure, each of superconducting coupler devices 108a, 108b, 108c. 108d can include, but is not limited to, a quantum resonator, a bus, a transmission line, an electrode, a lead, and/or another superconducting coupler device.

In the example embodiment depicted in FIG. 1, one or more of superconducting coupler devices 108a. 108b, 108c. 108d can comprise one or more superconducting fuse devices 110a, 110b and/or one or more superconducting antifuse devices 112a, 112b, 112c. For instance, in the example embodiment illustrated in FIG. 1: superconducting coupler device 108a can comprise superconducting fuse device 110a and superconducting antifuse device 112a; superconducting coupler device 108b can comprise superconducting antifuse device 112b; superconducting coupler device 108c can comprise superconducting antifuse device 112c; and/or superconducting coupler device 108d can comprise superconducting fuse device 110b.

As illustrated in the example embodiment depicted in FIG. 1, superconducting antifuse device 112c can be partially provided on (e.g., formed on) superconducting coupler device 108c and capacitor pad 104b. For instance, in this example embodiment, superconducting antifuse device 112c can be partially provided on (e.g., formed on) superconducting coupler device 108c and capacitor pad 104b such that when superconducting antifuse device 112c is implemented (e.g., actuated and/or operated), it can generate an electrically conductive path along superconducting coupler device 108c that can couple superconducting coupler device 108c to capacitor pad 104b and thus to qubit 102 (e.g., via capacitor pad 104b). Additionally, or alternatively, in this example embodiment, Josephson junction 106 can comprise superconducting fuse device 110c.

In the example embodiment depicted in FIG. 1, one or more superconducting fuse devices 110a. 110b, 110c and/or one or more superconducting antifuse devices 112a, 112b, 112c can be used to alter the coupling (e.g., connectivity) between quantum computing elements of device 100 and/or the coupling (e.g., connectivity) between one or more quantum computing elements of device 100 and one or more external quantum computing elements (not illustrated in FIG. 1) that can be external to device 100. In some embodiments, one or more superconducting fuse devices 110a, 110b, 110c can be actuated (e.g., operated) to decouple quantum computing elements of device 100 from one another and/or to decouple one or more quantum computing elements of device 100 from one or more external quantum computing elements (not illustrated in FIG. 1) that can be external to device 100. In some embodiments, one or more superconducting antifuse devices 112a, 112b, 112c can be actuated (e.g., operated) to couple quantum computing elements of device 100 to one another and/or to couple one or more quantum computing elements of device 100 to one or more external quantum computing elements (not illustrated in FIG. 1) that can be external to device 100. In the example embodiment depicted in FIG. 1, based on actuating (e.g., operating) one or more superconducting fuse devices 110a, 110b, 110c and/or one or more superconducting antifuse devices 112a, 112b, 112c to decouple or couple, respectively, quantum computing elements of device 100 and/or to decouple or couple, respectively, one or more quantum computing elements of device 100 and one or more external quantum computing elements (e.g., external to device 100), device 100 can thereby facilitate a programmable and/or reprogrammable quantum circuit device.

In various embodiments of the subject disclosure, to actuate (e.g., operate) superconducting fuse devices 110*a*, 110*b*, 110*c* and/or superconducting antifuse devices 112*a*, 112*b*, 112*c*, such devices can be exposed to a laser output (e.g., exposed to a laser). In these embodiments, to expose such devices to a laser output, device 100, one or more superconducting fuse devices 110*a*, 110*b*, 110*c*, and/or one or more superconducting antifuse devices 112*a*, 112*b*, 112*c* can be coupled to an external device (not illustrated in the figures). For example, device 100, superconducting fuse device 110*a*, 110*b*, and/or 110*c*, and/or superconducting antifuse device 112*a*, 112*b*, and/or 112*c* can be coupled (e.g., via superconducting coupler device 108*a*, 108*b*, 108*c*, and/or 108*d*) to an external device that can be external to device 100 such as, for instance, a laser device and/or a pulse generator device.

In an example embodiment, although not depicted in FIG. 1, device 100, superconducting fuse device 110*a*, 110*b*, and/or 110*c*, and/or superconducting antifuse device 112*a*, 112*b*, and/or 112*c* can be coupled to a laser device including, but not limited to, a power amplifier, an optical laser device (e.g., that generates an optical laser output), an infrared laser device (e.g., that generates an infrared laser output), and/or another laser device that can be external to device 100 and can facilitate transmission and/or receipt of a laser of optical and/or infrared light to and/or from device 100, superconducting fuse device 110*a*, 110*b*, and/or 110*c*, and/or superconducting antifuse device 112*a*, 112*b*, and/or 112*c*. In another example embodiment, although not depicted in FIG. 1, device 100, superconducting fuse device 110*a*, 110*b*, and/or 110*c*, and/or superconducting antifuse device 112*a*, 112*b*, and/or 112*c* can be coupled to a pulse generator device including, but not limited to, an arbitrary waveform generator (AWG), a vector network analyzer (VNA), and/or another pulse generator device that can be external to device 100 and can transmit and/or receive pulses (e.g., microwave pulses, microwave signals, control signals, and/or another pulse) to and/or from device 100, superconducting fuse device 110*a*, 110*b*, and/or 110*c*, and/or superconducting antifuse device 112*a*, 112*b*, and/or 112*c*.

In accordance with one or more embodiments of the subject disclosure, such an external device described above (e.g., a power amplifier, an optical laser device, an infrared laser device, an AWG, a VNA, and/or another external device) can also be coupled to a computer comprising a memory that can store instructions thereon and a processor that can execute such instructions. For example, in these embodiments, such an external device described above (e.g., a power amplifier, an optical laser device, an infrared laser device, an AWG, a VNA, and/or another external device) can also be coupled to a computer 1512 described below with reference to FIG. 15, where computer 1512 can comprise a system memory 1516 that can store instructions thereon (e.g., software, routines, processing threads, and/or other instructions) and a processing unit 1514 that can execute such instructions. In these embodiments, such a computer can be employed to operate and/or control (e.g., via processing unit 1514 executing instructions stored on system memory 1516) such an external device described above (e.g., a power amplifier, an optical laser device, an infrared laser device, an AWG, a VNA, and/or another external device). For instance, in these embodiments, such a computer can be employed to enable the external device described above (e.g., a power amplifier, an optical laser device, an infrared laser device, an AWG, a VNA, and/or another external device) to: a) transmit and/or receive a laser of optical and/or infrared light to and/or from device 100, superconducting fuse device 110*a*, 110*b*, and/or 110*c*, and/or superconducting antifuse device 112*a*, 112*b*, and/or 112*c*; and/or b) transmit and/or receive pulses (e.g., microwave pulses, microwave signals, control signals, and/or another pulse) to and/or from device 100, superconducting fuse device 110*a*, 110*b*, and/or 110*c*, and/or superconducting antifuse device 112*a*, 112*b*, and/or 112*c*. In the embodiments described above, such a laser of optical and/or infrared light can constitute a laser output that can be provided to, for instance, device 100, superconducting fuse device 110*a*, 110*b*, and/or 110*c*, and/or superconducting antifuse device 112*a*, 112*b*, and/or 112*c* (e.g., via superconducting coupler device 108*a*, 108*b*, 108*c*, and/or 108*d*).

In the example embodiment illustrated in FIG. 1, based on exposure of superconducting fuse device 110*a* to a laser output (e.g., to a first laser output from a laser device), superconducting fuse device 110*a* can break an electrically conductive path along superconducting coupler device 108*a* to decouple superconducting coupler device 108*a* from a first quantum computing element and a second quantum computing element. For example, based on exposure of superconducting fuse device 110*a* to such a laser output, superconducting fuse device 110*a* can break an electrically conductive path along superconducting coupler device 108*a* to decouple superconducting coupler device 108*a* from qubit 102 (e.g., from capacitor pad 104*a* of qubit 102) and an external quantum computing element that can be external to device 100 (e.g., a qubit). In this example embodiment, based on exposure of superconducting antifuse device 112*a* to a laser output (e.g., to a second laser output from a laser device), superconducting antifuse device 112*a* can generate an electrically conductive path along superconducting coupler device 108*a* that can couple superconducting coupler device 108*a* to a ground (not illustrated in FIG. 1). In this example embodiment, based on exposure of superconducting antifuse device 112*b* to a laser output (e.g., to a third laser output from a laser device), superconducting antifuse device 112*b* can generate an electrically conductive path along superconducting coupler device 108*b* that can couple superconducting coupler device 108*b* to a first quantum computing element and a third quantum computing element. For example, based on exposure of superconducting antifuse device 112*b* to such a laser output, superconducting antifuse device 112*b* can generate an electrically conductive path along superconducting coupler device 108*b* that can couple superconducting coupler device 108*b* to qubit 102 (e.g., to capacitor pad 104*a* of qubit 102) and an external quantum computing element that can be external to device 100 (e.g., a readout device).

In the example embodiment illustrated in FIG. 1, based on exposure of superconducting antifuse device 112*c* to a laser output (e.g., to a fourth laser output from a laser device), superconducting antifuse device 112*c* can generate an electrically conductive path along superconducting coupler device 108*c* that can couple superconducting coupler device 108*c* to a first quantum computing element and a second quantum computing element. For example, based on exposure of superconducting antifuse device 112*c* to such a laser output, superconducting antifuse device 112*c* can generate an electrically conductive path along superconducting coupler device 108*c* that can couple superconducting coupler device 108*c* to qubit 102 (e.g., to capacitor pad 104*b* of qubit 102) and an external quantum computing element that can be external to device 100 (e.g., a readout device).

In the example embodiment illustrated in FIG. 1, based on exposure of superconducting fuse device 110b to a laser output (e.g., to a fifth laser output from a laser device), superconducting fuse device 110b can break an electrically conductive path along superconducting coupler device 108d to decouple superconducting coupler device 108d from a first quantum computing element and a second quantum computing element. For example, based on exposure of superconducting fuse device 110b to such a laser output, superconducting fuse device 110b can break an electrically conductive path along superconducting coupler device 108d to decouple superconducting coupler device 108d from qubit 102 (e.g., from capacitor pad 104a of qubit 102) and an external quantum computing element that can be external to device 100 (e.g., a qubit).

In the example embodiment illustrated in FIG. 1, based on exposure of superconducting fuse device 110c to a laser output (e.g., to a sixth laser output from a laser device), superconducting fuse device 110c can break an electrically conductive path along Josephson junction 106 to decouple capacitor pad 104a from capacitor pad 104b. For example, based on exposure of superconducting fuse device 110c to such a laser output, superconducting fuse device 110c can break an electrically conductive path along Josephson junction 106 to decouple capacitor pad 104a from capacitor pad 104b, thereby opening qubit 102 and effectively rendering it inoperable.

It should be appreciated that one or more superconducting fuse devices 110a, 110b, 110c and/or one or more superconducting antifuse devices 112a. 112b, 112c of device 100 can be actuated (e.g., operated) as described above to improve performance, accuracy, fidelity, and/or efficiency of a quantum computing device comprising device 100. It should also be appreciated that device 100 can effectively comprise and/or provide a programmable and/or a reprogrammable quantum circuit, where based on one or more performance criteria (e.g., frequency collisions, poor quality factor (Q) of a qubit related to its coherence, fidelity, accuracy, efficiency, and/or another performance criteria) the connectivity (e.g., coupling) of one or more quantum computing elements of device 100 (e.g., qubit 102, capacitor pad 104a and/or 104b, Josephson junction 106, one or more superconducting coupler devices 108a, 108b, 108c, 108d, and/or another quantum computing elements) can be configured and/or reconfigured to achieve one or more defined criteria.

Figure 2:
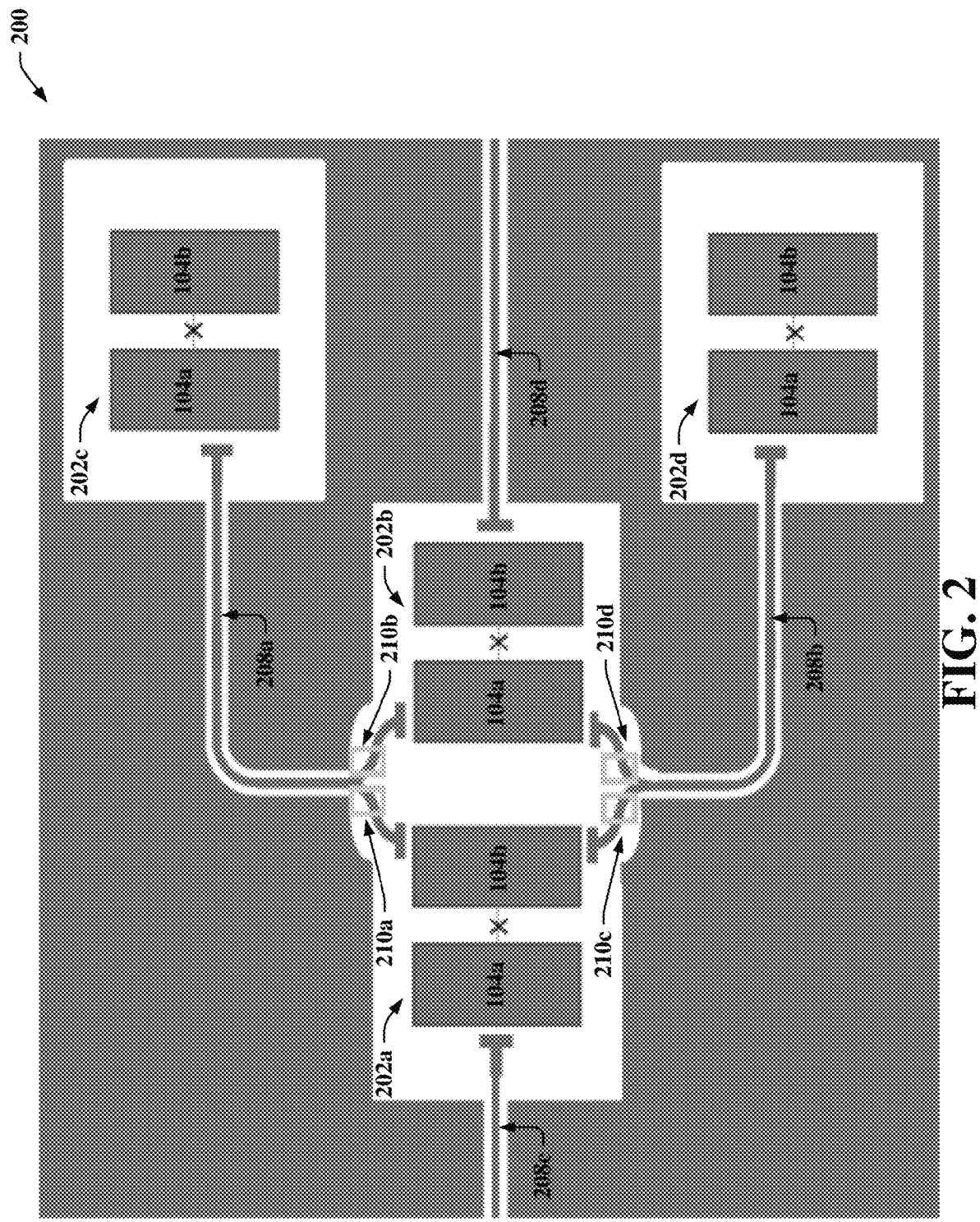

FIG. 2 illustrates an example, non-limiting device 200 that can facilitate a programmable and/or reprogrammable quantum circuit in accordance with one or more embodiments described herein. Repetitive description of like elements and/or processes employed in respective embodiments is omitted for sake of brevity.

Device 200 can comprise an example, non-limiting alternative embodiment of device 100 described above with reference to FIG. 1. As illustrated in the example embodiment depicted in FIG. 2, device 200 can comprise qubits 202a, 202b, 202c, 202d that can each comprise the same structure and/or functionality as that of qubit 102 described above with reference to the example embodiment depicted in FIG. 1. In the example embodiment illustrated in FIG. 2, qubits 202a, 202b can each be coupled to qubits 202c, 202d via superconducting coupler devices 208a, 208b, respectively. Superconducting coupler devices 208a, 208b can each comprise the same structure and/or functionality as that of superconducting coupler device 108a. 108b, 108c, and/or 108d described above with reference to the example embodiment depicted in FIG. 1. As illustrated in the example embodiment depicted in FIG. 2, qubits 202a, 202b can also be respectively coupled to superconducting coupler devices 208c. 208d of device 200. Superconducting coupler devices 208c. 208d can each comprise the same structure and/or functionality as that of superconducting coupler device 108a, 108b, 108c, and/or 108d described above with reference to the example embodiment depicted in FIG. 1. In some embodiments, superconducting coupler devices 208c. 208d can each be coupled to a quantum computing element and/or another component that is external to device 200 and thus, not illustrated in FIG. 2.

In the example embodiment depicted in FIG. 2, superconducting coupler device 208a can comprise superconducting fuse devices 210a. 210b and superconducting coupler device 208b can comprise superconducting fuse devices 210c, 210d. Additionally, or alternatively, in this example embodiment, superconducting fuse devices 210a, 210b can be actuated (e.g., operated) to decouple qubits 202a, 202b, respectively, from qubit 202c and/or superconducting fuse devices 210c, 210d can be actuated (e.g., operated) to decouple qubits 202a, 202b, respectively, from qubit 202d.

As described above with reference to the example embodiment depicted in FIG. 1, to actuate (e.g., operate) superconducting fuse devices 210a, 210b, 210c, 210d, such devices can be exposed to a laser output (e.g., exposed to a laser). In the example embodiment depicted in FIG. 2, to expose superconducting fuse devices 210a, 210b, 210c, 210d to a laser output, device 200 and/or one or more superconducting fuse devices 210a. 210b, 210c, 210d can be coupled to one or more of the external devices described above with reference to the example embodiment illustrated in FIG. 1. For example, device 200 and/or one or more superconducting fuse devices 210a. 210b, 210c, 210d can be coupled to one or more external devices (not illustrated in FIG. 1) that can be external to device 200 such as, for instance, a laser device (e.g., a power amplifier, an optical laser device, and/or an infrared laser device), a pulse generator device (e.g., an AWG and/or a VNA), and/or a computer (e.g., computer 1512) that can be employed to operate and/or control such a laser device and/or pulse generator device (e.g., via processing unit 1514 executing instructions stored on system memory 1516). In this example, such a computer can be employed to enable the laser device and/or the pulse generator device to respectively: a) transmit and/or receive a laser of optical and/or infrared light to and/or from device 200 and/or superconducting fuse device 210a. 210b, 210c, and/or 210d; and/or b) transmit and/or receive pulses (e.g., microwave pulses, microwave signals, control signals, and/or another pulse) to and/or from device 200 and/or superconducting fuse device 210a. 210b, 210c and/or 210d. In this example, such a laser of optical and/or infrared light can constitute a laser output that can be provided to, for instance, device 200 and/or superconducting fuse device 210a, 210b, 210c and/or 210d.

In the example embodiment illustrated in FIG. 2, based on exposure of superconducting fuse device 210a to a laser output (e.g., to a first laser output from a laser device), superconducting fuse device 210a can break an electrically conductive path along superconducting coupler device 208a to decouple superconducting coupler device 208a from qubit 202a (e.g., from capacitor pad 104b of qubit 202a) and qubit 202c (e.g., from capacitor pad 104a of qubit 202c). In the example embodiment illustrated in FIG. 2, based on exposure of superconducting fuse device 210b to a laser output (e.g., to a second laser output from a laser device), superconducting fuse device 210b can break an electrically conductive path along superconducting coupler device 208a to decouple superconducting coupler device 208a from qubit 202b (e.g., from capacitor pad 104a of qubit 202b) and qubit 202c (e.g., from capacitor pad 104a of qubit 202c).

In the example embodiment illustrated in FIG. 2, based on exposure of superconducting fuse device 210c to a laser output (e.g., to a third laser output from a laser device), superconducting fuse device 210c can break an electrically conductive path along superconducting coupler device 208b to decouple superconducting coupler device 208b from qubit 202a (e.g., from capacitor pad 104b of qubit 202a) and qubit 202d (e.g., from capacitor pad 104a of qubit 202d). In the example embodiment illustrated in FIG. 2, based on exposure of superconducting fuse device 210d to a laser output (e.g., to a fourth laser output from a laser device), superconducting fuse device 210d can break an electrically conductive path along superconducting coupler device 208b to decouple superconducting coupler device 208b from qubit 202b (e.g., from capacitor pad 104a of qubit 202b) and qubit 202d (e.g., from capacitor pad 104a of qubit 202d).

Figure 3:
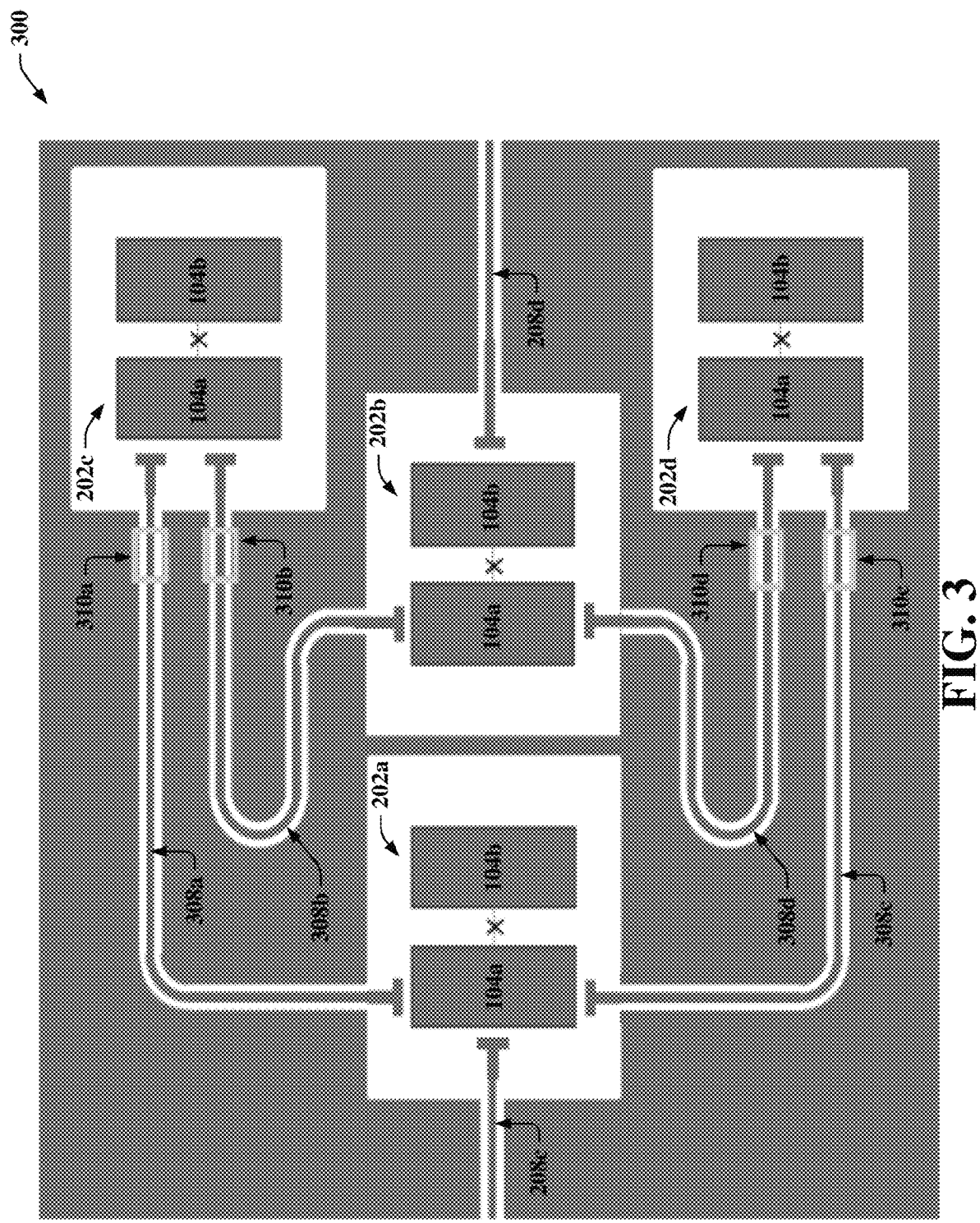

FIG. 3 illustrates an example, non-limiting device 300 that can facilitate a programmable and/or reprogrammable quantum circuit in accordance with one or more embodiments described herein. Repetitive description of like elements and/or processes employed in respective embodiments is omitted for sake of brevity.

Device 300 can comprise an example, non-limiting alternative embodiment of device 200 described above with reference to FIG. 2. As illustrated in the example embodiment depicted in FIG. 3, device 300 can comprise qubits 202a, 202b, 202c, 202d. In the example embodiment illustrated in FIG. 3, qubits 202a, 202b can each be coupled to qubit 202c via superconducting coupler devices 308a, 308b, respectively. In the example embodiment illustrated in FIG. 3, qubits 202a, 202b can each be coupled to qubit 202d via superconducting coupler devices 308c, 308d, respectively. Superconducting coupler devices 308a, 308b, 308c, 308d can each comprise the same structure and/or functionality as that of superconducting coupler device 208a, 208b, 208c, and/or 208d described above with reference to the example embodiment depicted in FIG. 2. As illustrated in the example embodiment depicted in FIG. 3, qubits 202a, 202b can also be respectively coupled to superconducting coupler devices 208c, 208d of device 300. In some embodiments, superconducting coupler devices 208c, 208d can each be coupled to a quantum computing element and/or another component that is external to device 300 and thus, not illustrated in FIG. 3.

In the example embodiment depicted in FIG. 3: superconducting coupler device 308a can comprise a superconducting fuse device 310a; superconducting coupler device 308b can comprise a superconducting fuse device 310b; superconducting coupler device 308c can comprise a superconducting fuse device 310c; and/or superconducting coupler device 308d can comprise a superconducting fuse device 310d. Superconducting fuse devices 310a, 310b, 310c, 310d can each comprise the same structure and/or functionality as that of superconducting fuse device 210a, 210b, 210c, and/or 210d described above with reference to the example embodiment depicted in FIG. 2. In this example embodiment, superconducting fuse devices 310a, 310b can be actuated (e.g., operated) to decouple qubits 202a, 202b, respectively, from qubit 202c. Additionally, or alternatively, in this example embodiment, superconducting fuse devices 310c, 310d can be actuated (e.g., operated) to decouple qubits 202a, 202b, respectively, from qubit 202d.

As described above with reference to the example embodiment depicted in FIG. 1, to actuate (e.g., operate) superconducting fuse devices 310a. 310b, 310c, 310d, such devices can be exposed to a laser output (e.g., exposed to a laser). In the example embodiment depicted in FIG. 3, to expose superconducting fuse devices 310a, 310b, 310c, 310d to a laser output, device 300 and/or one or more superconducting fuse devices 310a, 310b, 310c, 310d can be coupled to one or more of the external devices described above with reference to the example embodiment illustrated in FIG. 1. For example, device 300 and/or one or more superconducting fuse devices 310a, 310b, 310c, 310d can be coupled to one or more external devices (not illustrated in FIG. 3) that can be external to device 300 such as, for instance, a laser device (e.g., a power amplifier, an optical laser device, and/or an infrared laser device), a pulse generator device (e.g., an AWG and/or a VNA), and/or a computer (e.g., computer 1512) that can be employed to operate and/or control such a laser device and/or pulse generator device (e.g., via processing unit 1514 executing instructions stored on system memory 1516). In this example, such a computer can be employed to enable the laser device and/or the pulse generator device to respectively: a) transmit and/or receive a laser of optical and/or infrared light to and/or from device 300 and/or superconducting fuse device 310a, 310b, 310c, and/or 310d; and/or b) transmit and/or receive pulses (e.g., microwave pulses, microwave signals, control signals, and/or another pulse) to and/or from device 300 and/or superconducting fuse device 310a, 310b, 310c and/or 310d. In this example, such a laser of optical and/or infrared light can constitute a laser output that can be provided to, for instance, device 300 and/or superconducting fuse device 310a, 310b, 310c and/or 310d.

In the example embodiment illustrated in FIG. 3, based on exposure of superconducting fuse device 310a to a laser output (e.g., to a first laser output from a laser device), superconducting fuse device 310a can break an electrically conductive path along superconducting coupler device 308a to decouple superconducting coupler device 308a from qubit 202a (e.g., from capacitor pad 104a of qubit 202a) and qubit 202c (e.g., from capacitor pad 104a of qubit 202c). In the example embodiment illustrated in FIG. 3, based on exposure of superconducting fuse device 310b to a laser output (e.g., to a second laser output from a laser device), superconducting fuse device 310b can break an electrically conductive path along superconducting coupler device 308b to decouple superconducting coupler device 308b from qubit 202b (e.g., from capacitor pad 104a of qubit 202b) and qubit 202c (e.g., from capacitor pad 104a of qubit 202c).

In the example embodiment illustrated in FIG. 3, based on exposure of superconducting fuse device 310c to a laser output (e.g., to a third laser output from a laser device), superconducting fuse device 310c can break an electrically conductive path along superconducting coupler device 308c to decouple superconducting coupler device 308c from qubit 202a (e.g., from capacitor pad 104a of qubit 202a) and qubit 202d (e.g., from capacitor pad 104a of qubit 202d). In the example embodiment illustrated in FIG. 3, based on exposure of superconducting fuse device 310d to a laser output (e.g., to a fourth laser output from a laser device), superconducting fuse device 310d can break an electrically conductive path along superconducting coupler device 308d to decouple superconducting coupler device 308d from qubit 202b (e.g., from capacitor pad 104a of qubit 202b) and qubit 202d (e.g., from capacitor pad 104a of qubit 202d).

Figure 4:
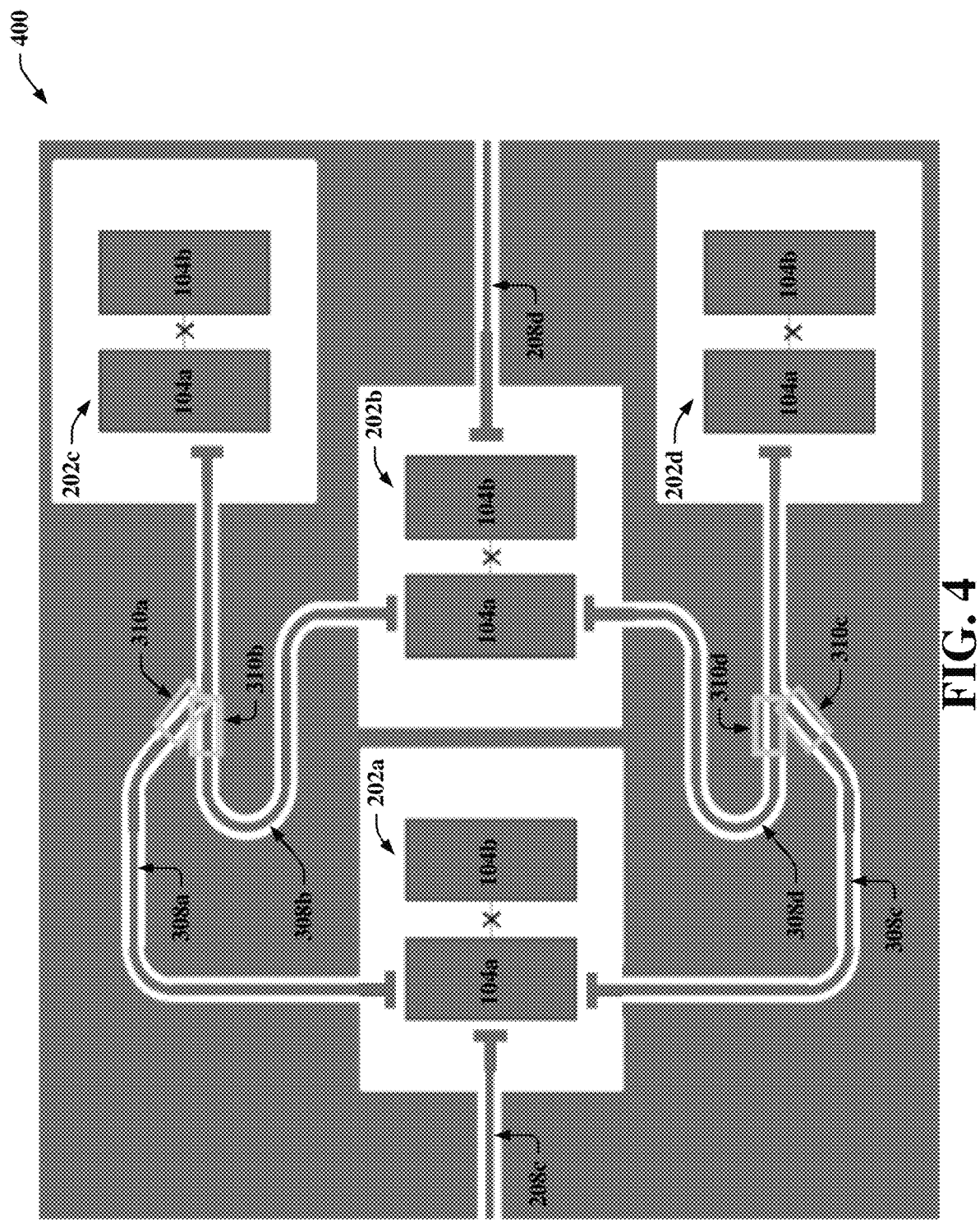

FIG. 4 illustrates an example, non-limiting device 400 that can facilitate a programmable and/or reprogrammable quantum circuit in accordance with one or more embodiments described herein. Repetitive description of like elements and/or processes employed in respective embodiments is omitted for sake of brevity.

Device 400 can comprise an example, non-limiting alternative embodiment of device 300 described above with reference to FIG. 3. As illustrated in the example embodiment depicted in FIG. 4, device 400 can comprise qubits 202a, 202b, 202c, 202d. In the example embodiment illustrated in FIG. 4, qubits 202a, 202b can each be coupled to qubit 202c via superconducting coupler devices 308a. 308b, respectively. In the example embodiment illustrated in FIG. 4, qubits 202a, 202b can each be coupled to qubit 202d via superconducting coupler devices 308c. 308d, respectively. As illustrated in the example embodiment depicted in FIG. 4, qubits 202a, 202b can also be respectively coupled to superconducting coupler devices 208c. 208d of device 400. In some embodiments, superconducting coupler devices 208c, 208d can each be coupled to a quantum computing element and/or another component that is external to device 400 and thus, not illustrated in FIG. 4.

In the example embodiment depicted in FIG. 3: superconducting coupler device 308a can comprise a superconducting fuse device 310a; superconducting coupler device 308b can comprise a superconducting fuse device 310b; superconducting coupler device 308c can comprise a superconducting fuse device 310c; and/or superconducting coupler device 308d can comprise a superconducting fuse device 310d. In this example embodiment, superconducting fuse devices 310a, 310b can be actuated (e.g., operated) to decouple qubits 202a, 202b, respectively, from qubit 202c. Additionally, or alternatively, in this example embodiment, superconducting fuse devices 310c. 310d can be actuated (e.g., operated) to decouple qubits 202a, 202b, respectively, from qubit 202d.

As described above with reference to the example embodiment depicted in FIG. 1, to actuate (e.g., operate) superconducting fuse devices 310a. 310b, 310c, 310d, such devices can be exposed to a laser output (e.g., exposed to a laser). In the example embodiment depicted in FIG. 4, to expose superconducting fuse devices 310a, 310b, 310c, 310d to a laser output, device 400 and/or one or more superconducting fuse devices 310a. 310b, 310c. 310d can be coupled to one or more of the external devices described above with reference to the example embodiment illustrated in FIG. 1. For example, device 400 and/or one or more superconducting fuse devices 310a, 310b, 310c, 310d can be coupled to one or more external devices (not illustrated in FIG. 4) that can be external to device 400 such as, for instance, a laser device (e.g., a power amplifier, an optical laser device, and/or an infrared laser device), a pulse generator device (e.g., an AWG and/or a VNA), and/or a computer (e.g., computer 1512) that can be employed to operate and/or control such a laser device and/or pulse generator device (e.g., via processing unit 1514 executing instructions stored on system memory 1516). In this example, such a computer can be employed to enable the laser device and/or the pulse generator device to respectively: a) transmit and/or receive a laser of optical and/or infrared light to and/or from device 400 and/or superconducting fuse device 310a, 310b, 310c, and/or 310d; and/or b) transmit and/or receive pulses (e.g., microwave pulses, microwave signals, control signals, and/or another pulse) to and/or from device 400 and/or superconducting fuse device 310a, 310b, 310c and/or 310d. In this example, such a laser of optical and/or infrared light can constitute a laser output that can be provided to, for instance, device 400 and/or superconducting fuse device 310a, 310b, 310c and/or 310d.

In the example embodiment illustrated in FIG. 4, based on exposure of superconducting fuse device 310a to a laser output (e.g., to a first laser output from a laser device), superconducting fuse device 310a can break an electrically conductive path along superconducting coupler device 308a to decouple superconducting coupler device 308a from superconducting coupler device 308b, qubit 202a (e.g., from capacitor pad 104a of qubit 202a), and qubit 202c (e.g., from capacitor pad 104a of qubit 202c). In the example embodiment illustrated in FIG. 4, based on exposure of superconducting fuse device 310b to a laser output (e.g., to a second laser output from a laser device), superconducting fuse device 310b can break an electrically conductive path along superconducting coupler device 308b to decouple superconducting coupler device 308b from superconducting coupler device 308a, qubit 202b (e.g., from capacitor pad 104a of qubit 202b), and qubit 202c (e.g., from capacitor pad 104a of qubit 202c).

In the example embodiment illustrated in FIG. 4, based on exposure of superconducting fuse device 310c to a laser output (e.g., to a third laser output from a laser device), superconducting fuse device 310c can break an electrically conductive path along superconducting coupler device 308c to decouple superconducting coupler device 308c from superconducting coupler device 308d, qubit 202a (e.g., from capacitor pad 104a of qubit 202a), and qubit 202d (e.g., from capacitor pad 104a of qubit 202d). In the example embodiment illustrated in FIG. 4, based on exposure of superconducting fuse device 310d to a laser output (e.g., to a fourth laser output from a laser device), superconducting fuse device 310d can break an electrically conductive path along superconducting coupler device 308d to decouple superconducting coupler device 308d from superconducting coupler device 308c, qubit 202b (e.g., from capacitor pad 104a of qubit 202b), and qubit 202d (e.g., from capacitor pad 104a of qubit 202d).

Figure 5:
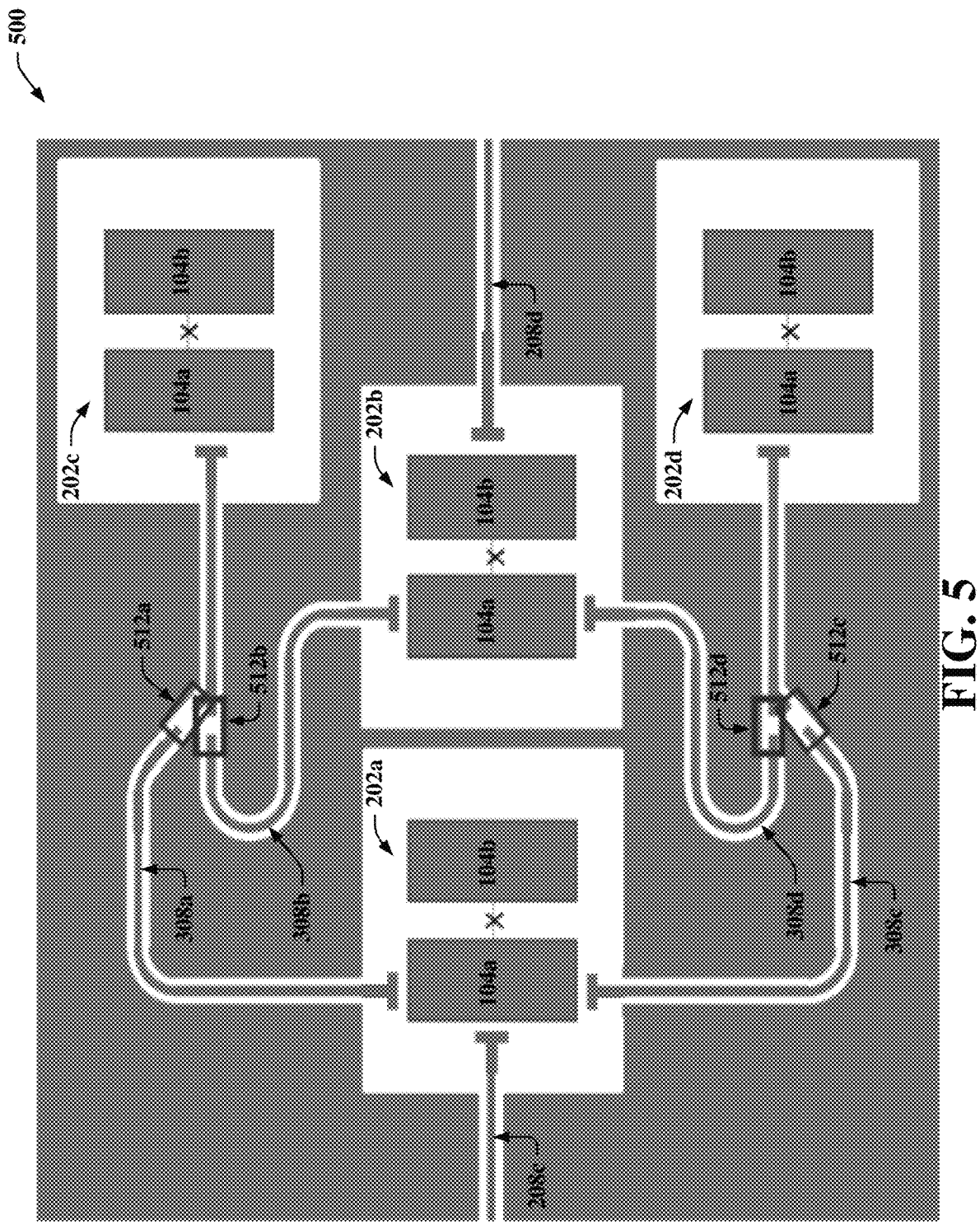

FIG. 5 illustrates an example, non-limiting device 500 that can facilitate a programmable and/or reprogrammable quantum circuit in accordance with one or more embodiments described herein. Repetitive description of like elements and/or processes employed in respective embodiments is omitted for sake of brevity.

Device 500 can comprise an example, non-limiting alternative embodiment of device 400 described above with reference to FIG. 4. As illustrated in the example embodiment depicted in FIG. 5, device 500 can comprise qubits 202a, 202b, 202c, 202d. In this example embodiment, qubits 202a, 202b can be respectively coupled to superconducting coupler devices 208c, 208d of device 500. In some embodiments, superconducting coupler devices 208c, 208d can each be coupled to a quantum computing element and/or another component that is external to device 500 and thus, not illustrated in FIG. 5.

As illustrated in the example embodiment depicted in FIG. 5, device 500 can further comprise superconducting coupler devices 308a, 308b, 308c, 308d. In the example embodiment depicted in FIG. 4: superconducting coupler device 308a can comprise a superconducting antifuse device 512a; superconducting coupler device 308b can comprise a superconducting antifuse device 512b; superconducting coupler device 308c can comprise a superconducting antifuse device 512c; and/or superconducting coupler device 308d can comprise a superconducting antifuse device 512d. Superconducting antifuse devices 512a, 512b, 512c, 512d can each comprise the same structure and/or functionality as that of superconducting antifuse device 112*a*, 112*b*, and/or 112*c* described above with reference to the example embodiment depicted in FIG. 1. In the example embodiment illustrated in FIG. 5, superconducting antifuse devices 512*a*, 512*b* can be actuated (e.g., operated) to respectively couple qubits 202*a*, 202*b* to qubit 202*c*. Additionally, or alternatively, in this example embodiment, superconducting antifuse devices 512*c*, 512*d* can be actuated (e.g., operated) to respectively couple qubits 202*a*, 202*b* to qubit 202*d*.

As described above with reference to the example embodiment depicted in FIG. 1, to actuate (e.g., operate) superconducting antifuse devices 512*a*, 512*b*, 512*c*, 512*d*, such devices can be exposed to a laser output (e.g., exposed to a laser). In the example embodiment depicted in FIG. 5, to expose superconducting antifuse devices 512*a*, 512*b*, 512*c*, 512*d* to a laser output, device 500 and/or one or more superconducting antifuse devices 512*a*, 512*b*, 512*c*, 512*d* can be coupled to one or more of the external devices described above with reference to the example embodiment illustrated in FIG. 1. For example, device 500 and/or one or more superconducting antifuse devices 512*a*, 512*b*, 512*c*, 512*d* can be coupled to one or more external devices (not illustrated in FIG. 5) that can be external to device 500 such as, for instance, a laser device (e.g., a power amplifier, an optical laser device, and/or an infrared laser device), a pulse generator device (e.g., an AWG and/or a VNA), and/or a computer (e.g., computer 1512) that can be employed to operate and/or control such a laser device and/or pulse generator device (e.g., via processing unit 1514 executing instructions stored on system memory 1516). In this example, such a computer can be employed to enable the laser device and/or the pulse generator device to respectively: a) transmit and/or receive a laser of optical and/or infrared light to and/or from device 500 and/or superconducting antifuse devices 512*a*, 512*b*, 512*c*, and/or 512*d*; and/or b) transmit and/or receive pulses (e.g., microwave pulses, microwave signals, control signals, and/or another pulse) to and/or from device 500 and/or superconducting antifuse devices 512*a*, 512*b*, 512*c*, and/or 512*d*. In this example, such a laser of optical and/or infrared light can constitute a laser output that can be provided to, for instance, device 500 and/or superconducting antifuse devices 512*a*, 512*b*, 512*c*, and/or 512*d*.

In the example embodiment illustrated in FIG. 5, based on exposure of superconducting antifuse device 512*a* to a laser output (e.g., to a first laser output from a laser device), superconducting antifuse device 512*a* can generate an electrically conductive path along superconducting coupler device 308*a* that can couple superconducting coupler device 308*a* to qubit 202*a* (e.g., to capacitor pad 104*a* of qubit 202*a*) and qubit 202*c* (e.g., to capacitor pad 104*a* of qubit 202*c*). In the example embodiment illustrated in FIG. 5, based on exposure of superconducting antifuse device 512*b* to a laser output (e.g., to a second laser output from a laser device), superconducting antifuse device 512*b* can generate an electrically conductive path along superconducting coupler device 308*b* that can couple superconducting coupler device 308*b* to qubit 202*b* (e.g., to capacitor pad 104*a* of qubit 202*b*) and qubit 202*c* (e.g., to capacitor pad 104*a* of qubit 202*c*).

In the example embodiment illustrated in FIG. 5, based on exposure of superconducting antifuse device 512*c* to a laser output (e.g., to a third laser output from a laser device), superconducting antifuse device 512*c* can generate an electrically conductive path along superconducting coupler device 308*c* that can couple superconducting coupler device 308*c* to qubit 202*a* (e.g., to capacitor pad 104*a* of qubit 202*a*) and qubit 202*d* (e.g., to capacitor pad 104*a* of qubit 202*d*). In the example embodiment illustrated in FIG. 5, based on exposure of superconducting antifuse device 512*d* to a laser output (e.g., to a fourth laser output from a laser device), superconducting antifuse device 512*d* can generate an electrically conductive path along superconducting coupler device 308*d* that can couple superconducting coupler device 308*d* to qubit 202*b* (e.g., to capacitor pad 104*a* of qubit 202*b*) and qubit 202*d* (e.g., to capacitor pad 104*a* of qubit 202*d*).

Figure 6A:
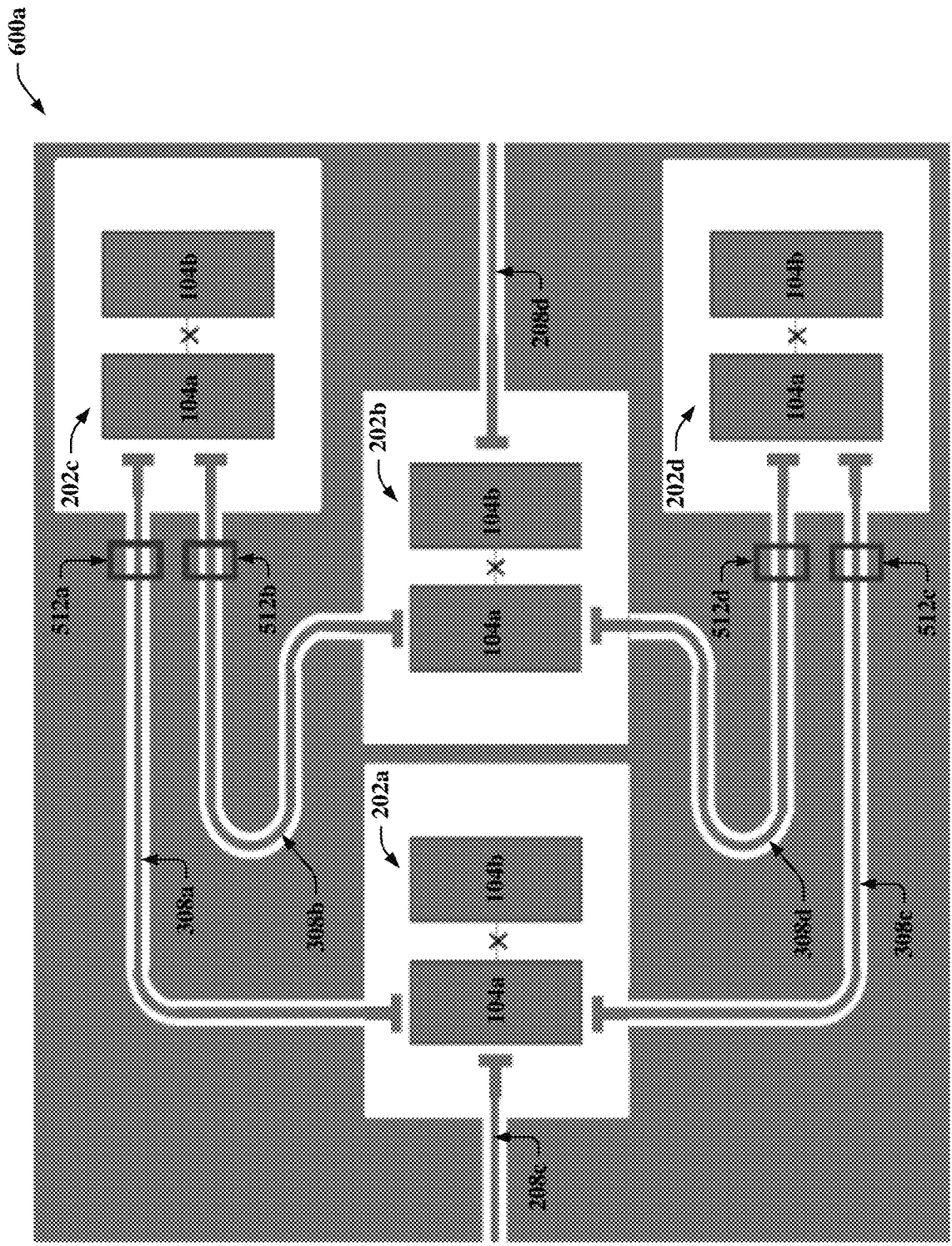

FIG. 6A illustrates an example, non-limiting device 600*a* that can facilitate a programmable and/or reprogrammable quantum circuit in accordance with one or more embodiments described herein. Repetitive description of like elements and/or processes employed in respective embodiments is omitted for sake of brevity.

Device 600*a* can comprise an example, non-limiting alternative embodiment of device 300 described above with reference to FIG. 3. As illustrated in the example embodiment depicted in FIG. 6A, device 600*a* can comprise qubits 202*a*, 202*b*, 202*c*, 202*d*. In this example embodiment, qubits 202*a*, 202*b* can be respectively coupled to superconducting coupler devices 208*c*, 208*d* of device 600*a*. In some embodiments, superconducting coupler devices 208*c*, 208*d* can each be coupled to a quantum computing element and/or another component that is external to device 600*a* and thus, not illustrated in FIG. 6A.

As illustrated in the example embodiment depicted in FIG. 6A, device 600*a* can further comprise superconducting coupler devices 308*a*, 308*b*, 308*c*, 308*d* that can respectively comprise superconducting antifuse devices 512*a*, 512*b*, 512*c*, 512*d*. In the example embodiment illustrated in FIG. 6A, superconducting antifuse devices 512*a*, 512*b* can be actuated (e.g., operated) to respectively couple superconducting coupler devices 308*a*, 308*b* to a ground (not illustrated in FIG. 6A). Additionally, or alternatively, in this example embodiment, superconducting antifuse devices 512*c*, 512*d* can be actuated (e.g., operated) to respectively couple superconducting coupler devices 308*c*. 308*d* to a ground (not illustrated in FIG. 6A).

As described above with reference to the example embodiment depicted in FIG. 1, to actuate (e.g., operate) superconducting antifuse devices 512*a*, 512*b*, 512*c*, 512*d*, such devices can be exposed to a laser output (e.g., exposed to a laser). In the example embodiment depicted in FIG. 6A, to expose superconducting antifuse devices 512*a*, 512*b*, 512*c*, 512*d* to a laser output, device 600*a* and/or one or more superconducting antifuse devices 512*a*, 512*b*, 512*c*, 512*d* can be coupled to one or more of the external devices described above with reference to the example embodiment illustrated in FIG. 1. For example, device 600*a* and/or one or more superconducting antifuse devices 512*a*, 512*b*, 512*c*, 512*d* can be coupled to one or more external devices (not illustrated in FIG. 6A) that can be external to device 600*a* such as, for instance, a laser device (e.g., a power amplifier, an optical laser device, and/or an infrared laser device), a pulse generator device (e.g., an AWG and/or a VNA), and/or a computer (e.g., computer 1512) that can be employed to operate and/or control such a laser device and/or pulse generator device (e.g., via processing unit 1514 executing instructions stored on system memory 1516). In this example, such a computer can be employed to enable the laser device and/or the pulse generator device to respectively: a) transmit and/or receive a laser of optical and/or infrared light to and/or from device 600*a* and/or superconducting antifuse devices 512*a*, 512*b*, 512*c*, and/or 512*d*; and/or b) transmit and/or receive pulses (e.g., microwave pulses, microwave signals, control signals, and/or another pulse) to and/or from device 600a and/or superconducting antifuse devices 512a, 512b, 512c, and/or 512d. In this example, such a laser of optical and/or infrared light can constitute a laser output that can be provided to, for instance, device 600a and/or superconducting antifuse devices 512a, 512b, 512c, and/or 512d.

In the example embodiment illustrated in FIG. 6A, based on exposure of superconducting antifuse device 512a to a laser output (e.g., to a first laser output from a laser device), superconducting antifuse device 512a can generate an electrically conductive path along superconducting coupler device 308a that can couple superconducting coupler device 308a to a ground (not illustrated in FIG. 6A), thereby effectively shorting superconducting coupler device 308a to ground. In the example embodiment illustrated in FIG. 6A, based on exposure of superconducting antifuse device 512b to a laser output (e.g., to a second laser output from a laser device), superconducting antifuse device 512b can generate an electrically conductive path along superconducting coupler device 308b that can couple superconducting coupler device 308b to a ground (not illustrated in FIG. 6A), thereby effectively shorting superconducting coupler device 308b to ground.

In the example embodiment illustrated in FIG. 6A, based on exposure of superconducting antifuse device 512c to a laser output (e.g., to a third laser output from a laser device), superconducting antifuse device 512c can generate an electrically conductive path along superconducting coupler device 308c that can couple superconducting coupler device 308c to a ground (not illustrated in FIG. 6A), thereby effectively shorting superconducting coupler device 308c to ground. In the example embodiment illustrated in FIG. 6A, based on exposure of superconducting antifuse device 512d to a laser output (e.g., to a fourth laser output from a laser device), superconducting antifuse device 512d can generate an electrically conductive path along superconducting coupler device 308d that can couple superconducting coupler device 308d to a ground (not illustrated in FIG. 6A), thereby effectively shorting superconducting coupler device 308d to ground.

Figure 6B:
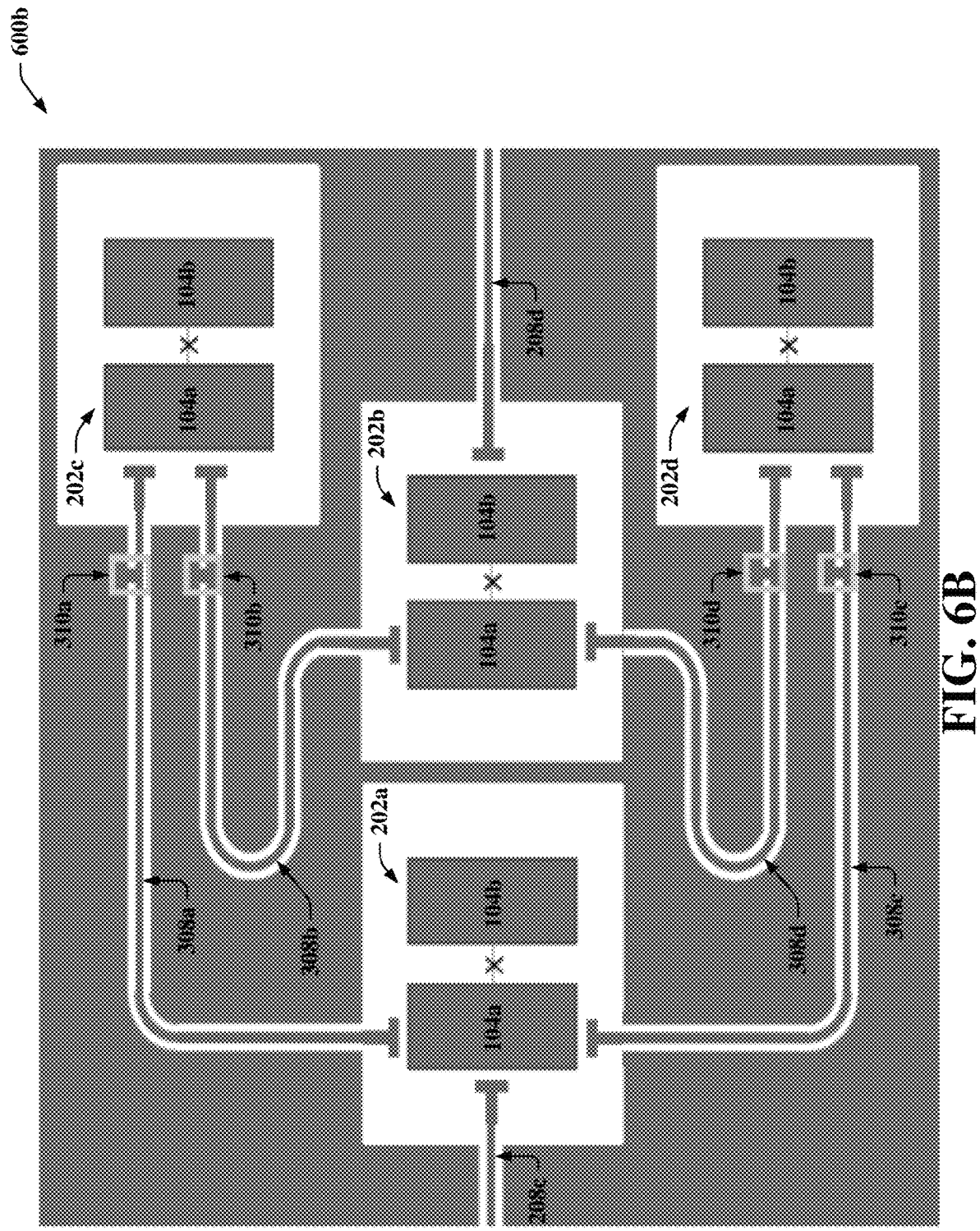

FIG. 6B illustrates an example, non-limiting device 600b that can facilitate a programmable and/or reprogrammable quantum circuit in accordance with one or more embodiments described herein. Repetitive description of like elements and/or processes employed in respective embodiments is omitted for sake of brevity.

Device 600b can comprise an example, non-limiting alternative embodiment of device 600a described above with reference to FIG. 6A. As illustrated in the example embodiment depicted in FIG. 6B, device 600b can comprise qubits 202a, 202b, 202c, 202d. In this example embodiment, qubits 202a, 202b can be respectively coupled to superconducting coupler devices 208c, 208d of device 600b. In some embodiments, superconducting coupler devices 208c, 208d can each be coupled to a quantum computing element and/or another component that is external to device 600b and thus, not illustrated in FIG. 6B.

As illustrated in the example embodiment depicted in FIG. 6B, device 600b can further comprise superconducting coupler devices 308a, 308b, 308c, 308d that can respectively comprise superconducting fuse devices 310a, 310b, 310c, 310d. In the example embodiment illustrated in FIG. 6B, superconducting fuse devices 310a. 310b can respectively couple (e.g., connect) superconducting coupler devices 308a. 308b to a ground (not illustrated in FIG. 6B). In this example embodiment, superconducting fuse devices 310c, 310d can respectively couple (e.g., connect) superconducting coupler devices 308c. 308d to a ground (not illustrated in FIG. 6B). In the example embodiment depicted in FIG. 6B, superconducting fuse devices 310a, 310b can be actuated (e.g., operated) to respectively decouple (e.g., disconnect) superconducting coupler devices 308a. 308b from the ground (not illustrated in FIG. 6B) and thereby respectively couple qubits 202a, 202b to qubit 202c. Additionally, or alternatively, in this example embodiment, superconducting fuse devices 310c. 310d can be actuated (e.g., operated) to respectively decouple (e.g., disconnect) superconducting coupler devices 308c, 308d from the ground (not illustrated in FIG. 6B) and thereby respectively couple qubits 202a, 202b to qubit 202d.

As described above with reference to the example embodiment depicted in FIG. 1, to actuate (e.g., operate) superconducting fuse devices 310a, 310b, 310c, 310d, such devices can be exposed to a laser output (e.g., exposed to a laser). In the example embodiment depicted in FIG. 6B, to expose superconducting fuse devices 310a, 310b, 310c, 310d to a laser output, device 600b and/or one or more superconducting fuse devices 310a, 310b, 310c, 310d can be coupled to one or more of the external devices described above with reference to the example embodiment illustrated in FIG. 1. For example, device 600b and/or one or more superconducting fuse devices 310a, 310b, 310c, 310d can be coupled to one or more external devices (not illustrated in FIG. 6B) that can be external to device 600b such as, for instance, a laser device (e.g., a power amplifier, an optical laser device, and/or an infrared laser device), a pulse generator device (e.g., an AWG and/or a VNA), and/or a computer (e.g., computer 1512) that can be employed to operate and/or control such a laser device and/or pulse generator device (e.g., via processing unit 1514 executing instructions stored on system memory 1516). In this example, such a computer can be employed to enable the laser device and/or the pulse generator device to respectively: a) transmit and/or receive a laser of optical and/or infrared light to and/or from device 600b and/or superconducting fuse devices 310a. 310b, 310c, and/or 310d; and/or b) transmit and/or receive pulses (e.g., microwave pulses, microwave signals, control signals, and/or another pulse) to and/or from device 600b and/or superconducting fuse devices 310a, 310b, 310c, and/or 310d. In this example, such a laser of optical and/or infrared light can constitute a laser output that can be provided to, for instance, device 600b and/or superconducting fuse devices 310a, 310b, 310c, and/or 310d.

In the example embodiment illustrated in FIG. 6B, based on exposure of superconducting fuse device 310a to a laser output (e.g., to a first laser output from a laser device), superconducting fuse device 310a can break an electrically conductive path along superconducting coupler device 308a that can decouple (e.g., disconnect) superconducting coupler device 308a from a ground (not illustrated in FIG. 6B) and thereby enable coupling of qubit 202a to qubit 202c. In the example embodiment illustrated in FIG. 6B, based on exposure of superconducting fuse device 310b to a laser output (e.g., to a second laser output from a laser device), superconducting fuse device 310b can break an electrically conductive path along superconducting coupler device 308b that can decouple (e.g., disconnect) superconducting coupler device 308b from a ground (not illustrated in FIG. 6B) and thereby enable coupling of qubit 202b to qubit 202c.

In the example embodiment illustrated in FIG. 6B, based on exposure of superconducting fuse device 310c to a laser output (e.g., to a third laser output from a laser device), superconducting fuse device 310c can break an electrically conductive path along superconducting coupler device 308c that can decouple (e.g., disconnect) superconducting coupler device 308c from a ground (not illustrated in FIG. 6B) and thereby enable coupling of qubit 202a to qubit 202d. In the example embodiment illustrated in FIG. 6B, based on exposure of superconducting fuse device 310d to a laser output (e.g., to a fourth laser output from a laser device), superconducting fuse device 310d can break an electrically conductive path along superconducting coupler device 308d that can decouple (e.g., disconnect) superconducting coupler device 308d from a ground (not illustrated in FIG. 6B) and thereby enable coupling of qubit 202b to qubit 202d.

Figure 7:
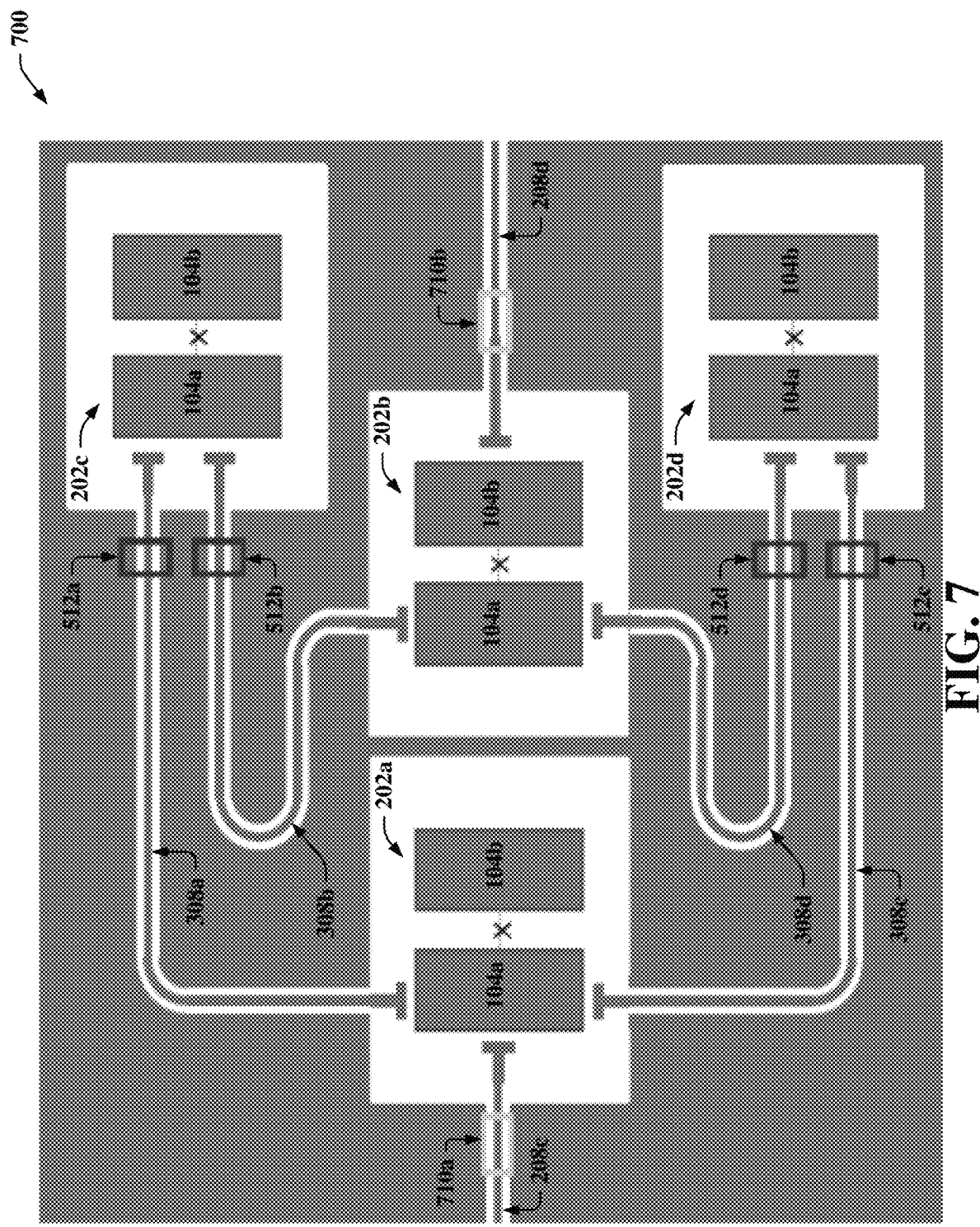

FIG. 7 illustrates an example, non-limiting device 700 that can facilitate a programmable and/or reprogrammable quantum circuit in accordance with one or more embodiments described herein. Repetitive description of like elements and/or processes employed in respective embodiments is omitted for sake of brevity.

Device 700 can comprise an example, non-limiting alternative embodiment of device 600a and/or 600b described above with reference to FIGS. 6A and 6B, respectively. As illustrated in the example embodiment depicted in FIG. 7, device 700 can comprise qubits 202a, 202b, 202c, 202d. In this example embodiment, qubits 202a, 202b can be respectively coupled to superconducting coupler devices 208c, 208d of device 700. In some embodiments, superconducting coupler devices 208c, 208d can each be coupled to a quantum computing element and/or another component that is external to device 700 and thus, not illustrated in FIG. 7. In the example embodiment depicted in FIG. 7, superconducting coupler devices 208c, 208d can respectively comprise superconducting fuse devices 710a, 710b. Superconducting fuse devices 710a, 710b can each comprise the same structure and/or functionality as that of superconducting fuse devices 110a, 110b, and/or 110c described above with reference to the example embodiment depicted in FIG. 1.

As illustrated in the example embodiment depicted in FIG. 7, device 700 can further comprise superconducting coupler devices 308a, 308b, 308c, 308d that can respectively comprise superconducting antifuse devices 512a, 512b, 512c, 512d. In the example embodiment illustrated in FIG. 7, superconducting antifuse devices 512a, 512b can be actuated (e.g., operated) to respectively couple superconducting coupler devices 308a, 308b to a ground (not illustrated in FIG. 7) as described above with reference to the example embodiments depicted in FIG. 6A and/or 6B. Additionally, or alternatively, in this example embodiment, superconducting antifuse devices 512c, 512d can be actuated (e.g., operated) to respectively couple superconducting coupler devices 308c. 308d to a ground (not illustrated in FIG. 7) as described above with reference to the example embodiments depicted in FIG. 6A and/or 6B.

As described above with reference to the example embodiment depicted in FIG. 1, to actuate (e.g., operate) superconducting fuse devices 710a, 710b, such devices can be exposed to a laser output (e.g., exposed to a laser). In the example embodiment depicted in FIG. 7, to expose superconducting fuse devices 710a, 710b to a laser output, device 700 and/or one or more superconducting fuse devices 710a. 710b can be coupled to one or more of the external devices described above with reference to the example embodiment illustrated in FIG. 1. For example, device 700 and/or one or more superconducting fuse devices 710a, 710b can be coupled to one or more external devices (not illustrated in FIG. 7) that can be external to device 700 such as, for instance, a laser device (e.g., a power amplifier, an optical laser device, and/or an infrared laser device), a pulse generator device (e.g., an AWG and/or a VNA), and/or a computer (e.g., computer 1512) that can be employed to operate and/or control such a laser device and/or pulse generator device (e.g., via processing unit 1514 executing instructions stored on system memory 1516). In this example, such a computer can be employed to enable the laser device and/or the pulse generator device to respectively: a) transmit and/or receive a laser of optical and/or infrared light to and/or from device 700 and/or superconducting fuse device 710a and/or 710b; and/or b) transmit and/or receive pulses (e.g., microwave pulses, microwave signals, control signals, and/or another pulse) to and/or from device 700 and/or superconducting fuse device 710a and/or 710b. In this example, such a laser of optical and/or infrared light can constitute a laser output that can be provided to, for instance, device 700 and/or superconducting fuse device 710a and/or 710b.

In the example embodiment illustrated in FIG. 7, based on exposure of superconducting fuse device 710a to a laser output (e.g., to a first laser output from a laser device), superconducting fuse device 710a can break an electrically conductive path along superconducting coupler device 208c to decouple superconducting coupler device 208c from qubit 202a (e.g., from capacitor pad 104a of qubit 202a) and from, for instance, a quantum computing element (e.g., a qubit, a readout device, and/or another quantum computing element) that can be coupled to superconducting coupler device 208c and/or external to device 700. In the example embodiment illustrated in FIG. 7, based on exposure of superconducting fuse device 710b to a laser output (e.g., to a second laser output from a laser device), superconducting fuse device 710b can break an electrically conductive path along superconducting coupler device 208d to decouple superconducting coupler device 208d from qubit 202b (e.g., from capacitor pad 104b of qubit 202b) and from, for instance, a quantum computing element (e.g., a qubit, a readout device, and/or another quantum computing element) that can be coupled to superconducting coupler device 208d and/or external to device 700.

Figure 8:
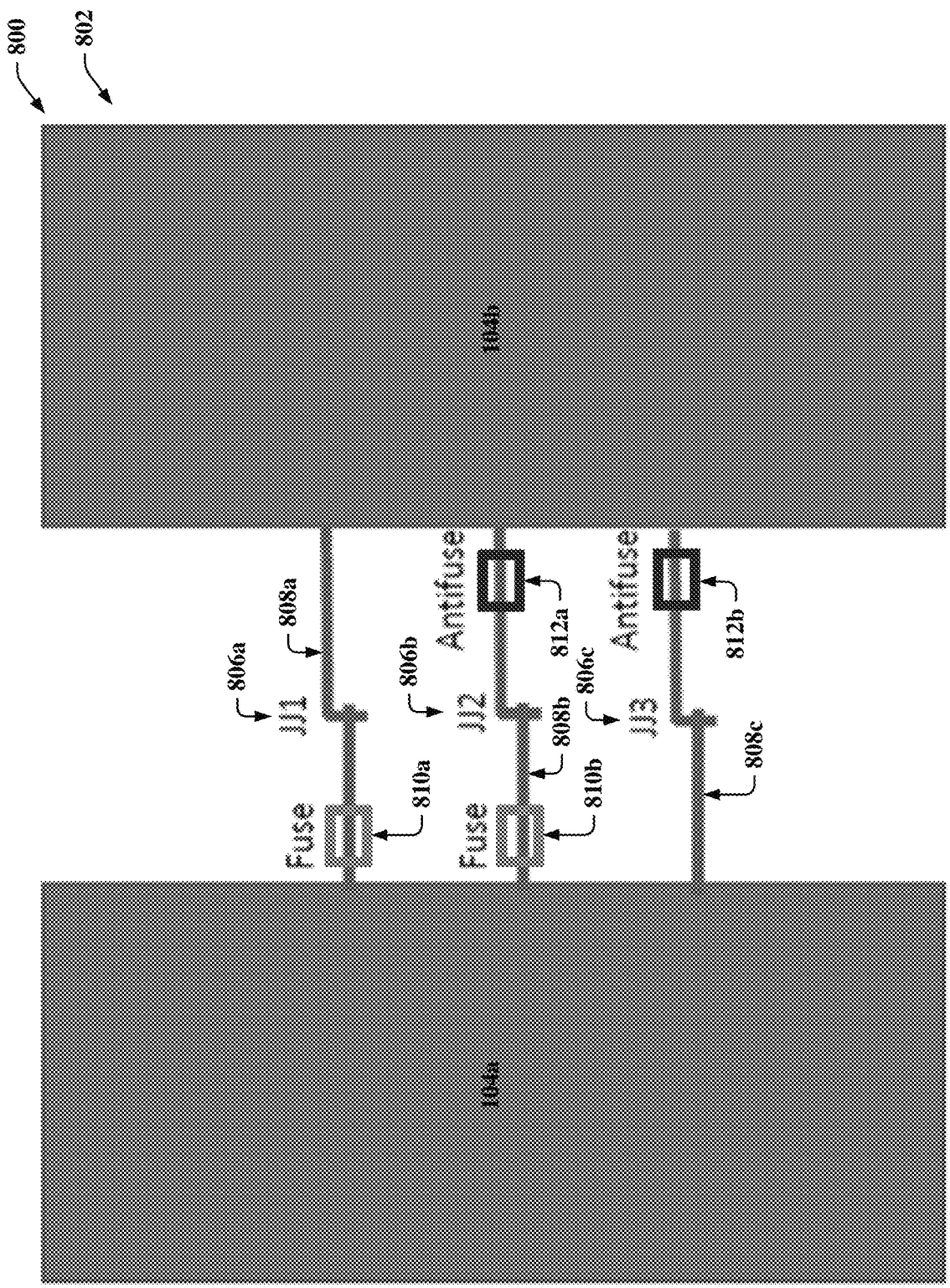

FIG. 8 illustrates an example, non-limiting device 800 that can facilitate a programmable and/or reprogrammable quantum circuit in accordance with one or more embodiments described herein. Repetitive description of like elements and/or processes employed in respective embodiments is omitted for sake of brevity.

Device 800 depicted in the example embodiment illustrated in FIG. 8 can comprise a qubit device comprising a qubit 802. Qubit 802 can comprise an example, non-limiting alternative embodiment of qubit 102 described above with reference to the example embodiment depicted in FIG. 1. As illustrated in the example embodiment depicted in FIG. 8, qubit 802 can comprise capacitor pads 104a, 104b that can be coupled to one another via superconducting coupler devices 808a, 808b, 808c and/or Josephson junctions 806a, 806b, 806c (denoted as "JJ1," "JJ2," and "JJ3," respectively, in FIG. 8). Superconducting coupler devices 808a, 808b, 808c can each comprise the same structure and/or functionality as that of superconducting coupler device 108a, 108b, 108c, and/or 108d described above with reference to the example embodiment depicted in FIG. 1. Josephson junctions 806a, 806b, 806c can each comprise the same structure and/or functionality of Josephson junction 106 described above with reference to the example embodiment depicted in FIG. 1.

As illustrated in the example embodiment depicted in FIG. 8: superconducting coupler device 808a can comprise a superconducting fuse device 810a; superconducting coupler device 808b can comprise a superconducting fuse device 810b and a superconducting antifuse device 812a; and/or superconducting coupler device 808c can comprise a superconducting antifuse device 812b. Superconducting fuse devices 810a, 810b can each comprise the same structure and/or functionality as that of superconducting fuse device 110a, 110b, and/or 110c described above with reference to the example embodiment depicted in FIG. 1. Superconducting antifuse devices 812a, 812b can each comprise the same structure and/or functionality as that of superconducting antifuse device 112a, 112b, and/or 112c described above with reference to the example embodiment depicted in FIG. 1.

In the example embodiment illustrated in FIG. 8, superconducting fuse device 810a and/or 810b can be actuated (e.g., operated) to decouple capacitor pad 104a from capacitor pad 104b. In this example embodiment, superconducting antifuse device 812a and/or 812b can be actuated (e.g., operated) to respectively couple superconducting coupler device 808b and/or 808c to a ground (not illustrated in FIG. 8).

As described above with reference to the example embodiment depicted in FIG. 1, to actuate (e.g., operate) superconducting fuse devices 810a, 810b and/or superconducting antifuse devices 812a, 812b, such devices can be exposed to a laser output (e.g., exposed to a laser). In the example embodiment depicted in FIG. 8, to expose superconducting fuse devices 810a, 810b and/or superconducting antifuse devices 812a, 812b to a laser output, device 800, one or more superconducting fuse devices 810a, 810b, and/or one or more superconducting antifuse devices 812a, 812b can be coupled to one or more of the external devices described above with reference to the example embodiment illustrated in FIG. 1. For example, device 800, one or more superconducting fuse devices 810a. 810b, and/or one or more superconducting antifuse devices 812a, 812b can be coupled to one or more external devices (not illustrated in FIG. 8) that can be external to device 800 such as, for instance, a laser device (e.g., a power amplifier, an optical laser device, and/or an infrared laser device), a pulse generator device (e.g., an AWG and/or a VNA), and/or a computer (e.g., computer 1512) that can be employed to operate and/or control such a laser device and/or pulse generator device (e.g., via processing unit 1514 executing instructions stored on system memory 1516). In this example, such a computer can be employed to enable the laser device and/or the pulse generator device to respectively: a) transmit and/or receive a laser of optical and/or infrared light to and/or from device 800, superconducting fuse device 810a and/or 810b, and/or superconducting antifuse device 812a and/or 812b; and/or b) transmit and/or receive pulses (e.g., microwave pulses, microwave signals, control signals, and/or another pulse) to and/or from device 800, superconducting fuse device 810a and/or 810b, and/or superconducting antifuse device 812a and/or 812b. In this example, such a laser of optical and/or infrared light can constitute a laser output that can be provided to, for instance, device 800, superconducting fuse device 810a and/or 810b, and/or superconducting antifuse device 812a and/or 812b.

In the example embodiment illustrated in FIG. 8, based on exposure of superconducting fuse device 810a to a laser output (e.g., to a first laser output from a laser device), superconducting fuse device 810a can break an electrically conductive path along superconducting coupler device 808a to decouple superconducting coupler device 808a and/or Josephson junction 806a from capacitor pads 104a, 104b of qubit 802.

In the example embodiment illustrated in FIG. 8, based on exposure of superconducting fuse device 810b to a laser output (e.g., to a second laser output from a laser device), superconducting fuse device 810b can break an electrically conductive path along superconducting coupler device 808b to decouple superconducting coupler device 808b and/or Josephson junction 806b from capacitor pads 104a, 104b of qubit 802. Additionally, or alternatively, in the example embodiment illustrated in FIG. 8, based on exposure of superconducting antifuse device 812a to a laser output (e.g., to a third laser output from a laser device), superconducting antifuse device 812a can generate an electrically conductive path along superconducting coupler device 808b that can couple superconducting coupler device 808b and/or Josephson junction 806b to a ground (not illustrated in FIG. 8), thereby effectively shorting superconducting coupler device 808b and/or Josephson junction 806b to ground. In the example embodiment illustrated in FIG. 8, based on exposure of superconducting antifuse device 812b to a laser output (e.g., to a fourth laser output from a laser device), superconducting antifuse device 812b can generate an electrically conductive path along superconducting coupler device 808c that can couple superconducting coupler device 808c and/or Josephson junction 806c to a ground (not illustrated in FIG. 8), thereby effectively shorting superconducting coupler device 808c and/or Josephson junction 806c to ground.

Figure 9:
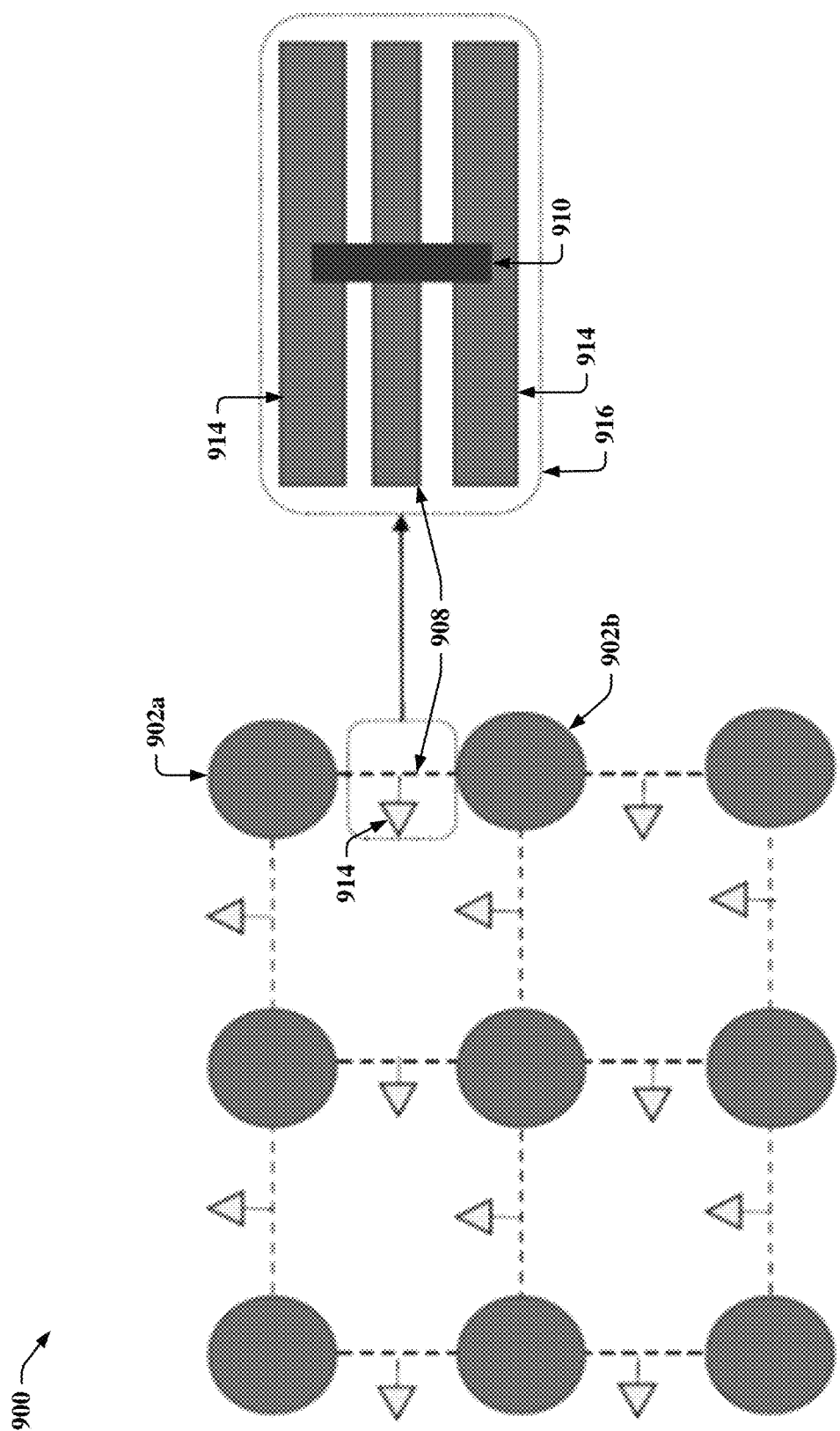

FIG. 9 illustrates a topology of an example, non-limiting device 900 that can facilitate a programmable and/or reprogrammable quantum circuit in accordance with one or more embodiments described herein. Repetitive description of like elements and/or processes employed in respective embodiments is omitted for sake of brevity.

As illustrated in the example embodiment depicted in FIG. 9, device 900 can be represented as a topology comprising multiple qubits (represented as dark gray circles in FIG. 9) that can be coupled to one another via multiple superconducting coupler devices (represented by dashed lines in FIG. 9) that can each be coupled to a ground (represented as light gray triangles in FIG. 9). Although device 900 can comprise multiple qubits that can be coupled to one another via multiple superconducting coupler devices that can each be coupled to a ground, for clarity, only qubits 902a, 902b, superconducting coupler device 908, and ground 914 are annotated in the example embodiment depicted in FIG. 9. Device 900 can comprise an example, non-limiting alternative embodiment of device 100 described above with reference to the example embodiment depicted in FIG. 1.

In the example embodiment illustrated in FIG. 9, qubits 902a, 902b can each comprise the same structure and/or functionality as that of qubit 102 described above with reference to the example embodiment depicted in FIG. 1. As illustrated in the example embodiment depicted in FIG. 9, qubits 902a, 902b can be coupled to one another via a superconducting coupler device 908, which can be coupled to a ground 914 (e.g., a ground plane of a semiconducting and/or superconducting device that can comprise device 900). Superconducting coupler device 908 can comprise the same structure and/or functionality as that of superconducting coupler device 108a, 108b, and/or 108c described above with reference to the example embodiment depicted in FIG. 1. As illustrated in inset 916 depicted in the example embodiment shown in FIG. 9, superconducting coupler device 908 can comprise a superconducting fuse device 910 provided on (e.g., formed on) superconducting coupler device 908 and ground 914 that can couple superconducting coupler device 908 to ground 914. Superconducting fuse device 910 can comprise the same structure and/or functionality as that of superconducting fuse device 110a, 110b, and/or 110c described above with reference to the example embodiment depicted in FIG. 1.

In the example embodiment illustrated in FIG. 9, superconducting fuse device 910 can be actuated (e.g., operated) to decouple superconducting coupler device 908 from ground 914, thereby enabling coupling of qubits 902a, 902b. As described above with reference to the example embodiment depicted in FIG. 1, to actuate (e.g., operate) superconducting fuse device 910, such a device can be exposed to a laser output (e.g., exposed to a laser). In the example embodiment depicted in FIG. 9, to expose superconducting fuse device 910 to a laser output, device 900 and/or superconducting fuse device 910 can be coupled to one or more of the external devices described above with reference to the example embodiment illustrated in FIG. 1. For example, device 900 and/or superconducting fuse device 910 can be coupled to one or more external devices (not illustrated in FIG. 9) that can be external to device 900 such as, for instance, a laser device (e.g., a power amplifier, an optical laser device, and/or an infrared laser device), a pulse generator device (e.g., an AWG and/or a VNA), and/or a computer (e.g., computer 1512) that can be employed to operate and/or control such a laser device and/or pulse generator device (e.g., via processing unit 1514 executing instructions stored on system memory 1516). In this example, such a computer can be employed to enable the laser device and/or the pulse generator device to respectively: a) transmit and/or receive a laser of optical and/or infrared light to and/or from device 900 and/or superconducting fuse device 910; and/or b) transmit and/or receive pulses (e.g., microwave pulses, microwave signals, control signals, and/or another pulse) to and/or from device 900 and/or superconducting fuse device 910. In this example, such a laser of optical and/or infrared light can constitute a laser output that can be provided to, for instance, device 900 and/or superconducting fuse device 910.

In the example embodiment illustrated in FIG. 9, based on exposure of superconducting fuse device 910 to a laser output, superconducting fuse device 910 can break an electrically conductive path between superconducting coupler device 908 and ground 914 to decouple superconducting coupler device 908 from ground 914, thereby enabling coupling of qubits 902a, 902b. In some embodiments, superconducting fuse device 910 is not actuated (e.g., not exposed to such a laser output) to enable device 900 to maintain the above described coupling of superconducting coupler device 908 to ground 914, which can enable qubit 902a to be decoupled from qubit 902b.

FIGS. 10A, 10B, and 10C illustrate topologies of example, non-limiting devices 1000a, 1000b, 1000c, respectively, that can each facilitate a programmable and/or reprogrammable quantum circuit in accordance with one or more embodiments described herein. Repetitive description of like elements and/or processes employed in respective embodiments is omitted for sake of brevity.

As illustrated in the example embodiments depicted in FIGS. 10A, 10B, and 10C, devices 1000a, 1000b, 1000c, respectively, can each be represented as a topology comprising multiple qubits (represented as varying shades of gray circles in FIGS. 10A, 10B, and 10C) that can be coupled to one another via multiple superconducting coupler devices (represented by dashed lines in FIGS. 10A, 10B, and 10C) that can each be coupled to a ground (represented as light gray triangles in FIGS. 10A, 10B, and 10C). Although devices 1000a, 1000b, 1000c can each comprise multiple qubits that can be coupled to one another via multiple superconducting coupler devices that can each be coupled to a ground, for clarity, only certain elements of devices 1000a, 1000b, and/or 1000c are annotated in the example embodiments depicted in FIGS. 10A, 10B, and 10C. Devices 1000a, 1000b, 1000c can each comprise an example, non-limiting alternative embodiment of device 900 described above with reference to the example embodiment depicted in FIG. 9.

Although not illustrated in the example embodiments depicted in FIGS. 10A, 10B, and 10C, one or more superconducting coupler devices of device 1000a, 1000b, and/or 1000c can comprise one or more superconducting fuse devices. In the example embodiments depicted in FIGS. 10A, 10B, and 10C, such one or more superconducting fuse devices can each comprise the same structure and/or functionality as that of superconducting fuse device 110a, 110b, and/or 110c described above with reference to the example embodiment depicted in FIG. 1. Additionally, or alternatively, although not illustrated in the example embodiments depicted in FIGS. 10A, 10B, and 10C, one or more superconducting coupler devices of device 1000a, 1000b, and/or 1000c can further comprise one or more superconducting antifuse devices. In the example embodiments depicted in FIGS. 10A, 10B, and 10C, such one or more superconducting antifuse devices can each comprise the same structure and/or functionality as that of superconducting antifuse device 112a, 112b, and/or 112c described above with reference to the example embodiment depicted in FIG. 1. In embodiments where one or more superconducting coupler devices of device 1000a, 1000b, and/or 1000c comprise one or more superconducting fuse devices and/or one or more superconducting antifuse devices, such superconducting fuse and/or antifuse device(s) can be actuated (e.g., operated) in the same manner (e.g., via exposure to a laser) as described above with reference to the example embodiments depicted in FIGS. 1-9.

As illustrated in the example embodiment depicted in FIG. 10A, device 1000a can comprise multiple (e.g., nine) qubits 1002 (not annotated in FIG. 10A for clarity). Qubits 1002 can each comprise the same structure and/or functionality as that of qubit 102 described above with reference to the example embodiment depicted in FIG. 1. In the example embodiment illustrated in FIG. 10A, device 1000a can further comprise multiple (e.g., four) superconducting coupler devices 1008 (only one is annotated in FIG. 10A for clarity) that can be coupled to a qubit 1002a of qubits 1002. Superconducting coupler devices 1008 can each comprise the same structure and/or functionality as that of superconducting coupler device 108a, 108b, 108c, and/or 108d described above with reference to the example embodiment depicted in FIG. 1. Although not illustrated in the example embodiment depicted in FIG. 10A, superconducting coupler devices 1008 can each comprise a superconducting fuse device that can enable coupling of each superconducting coupler device 1008 to a ground 1014 of device 1000a in the same manner as superconducting fuse device 910 can enable coupling of superconducting coupler device 908 to ground 914 of device 900 described above with reference to the example embodiment depicted in FIG. 9. As illustrated in the example embodiment depicted in FIG. 10A, by not actuating the superconducting fuse devices of superconducting coupler devices 1008 around qubit 1002a, the above described coupling of superconducting coupler devices 1008 to respective grounds 1014 can be maintained and device 1000a can thereby enable qubit 1002a to remain decoupled from all other qubits 1002 of device 1000a.

As illustrated in the example embodiment depicted in FIG. 10B, device 1000b can comprise multiple (e.g., nine) qubits 1002 (not annotated in FIG. 10B for clarity). In the example embodiment illustrated in FIG. 10B, device 1000b can further comprise multiple (e.g., six) superconducting coupler devices 1008 (only one is annotated in FIG. 10B for clarity) that can be coupled to various qubits 1002 of device 1000b. Although not illustrated in the example embodiment depicted in FIG. 10B, superconducting coupler devices 1008 can each comprise a superconducting fuse device that can enable coupling of each superconducting coupler device 1008 to a ground 1014 of device 1000b in the same manner as superconducting fuse device 910 can enable coupling of superconducting coupler device 908 to ground 914 of device 900 described above with reference to the example embodiment depicted in FIG. 9. As illustrated in the example embodiment depicted in FIG. 10B, by not actuating the superconducting fuse devices of certain superconducting coupler devices 1008 on device 1000b, the above described coupling of such superconducting coupler devices 1008 to respective grounds 1014 can be maintained and device 1000b can thereby provide a topology comprising multiple (e.g., three) independent sets 1018 (only one is annotated in FIG. 10B for clarity) of multiple (e.g., three) qubits 1002b of qubits 1002.

As illustrated in the example embodiment depicted in FIG. 10C, device 1000c can comprise multiple (e.g., nine) qubits 1002 (not annotated in FIG. 10C for clarity). In the example embodiment illustrated in FIG. 10C, device 1000c can further comprise multiple (e.g., eight) superconducting coupler devices 1008 (only one is annotated in FIG. 10C for clarity) that can be coupled to various qubits 1002 of device 1000c. Although not illustrated in the example embodiment depicted in FIG. 10C, superconducting coupler devices 1008 can each comprise a superconducting fuse device that can enable coupling of each superconducting coupler device 1008 to a ground 1014 of device 1000c in the same manner as superconducting fuse device 910 can enable coupling of superconducting coupler device 908 to ground 914 of device 900 described above with reference to the example embodiment depicted in FIG. 9. As illustrated in the example embodiment depicted in FIG. 10C, by not actuating the superconducting fuse devices of certain superconducting coupler devices 1008 on device 1000c, the above described coupling of such superconducting coupler devices 1008 to respective grounds 1014 can be maintained and device 1000c can thereby enable conversion of a 3-by-3 (3×3) topology comprising nine qubits 1002 to a 2-by-2 (2×2) topology comprising four qubits 1002c of qubits 1002.

Figure 11:
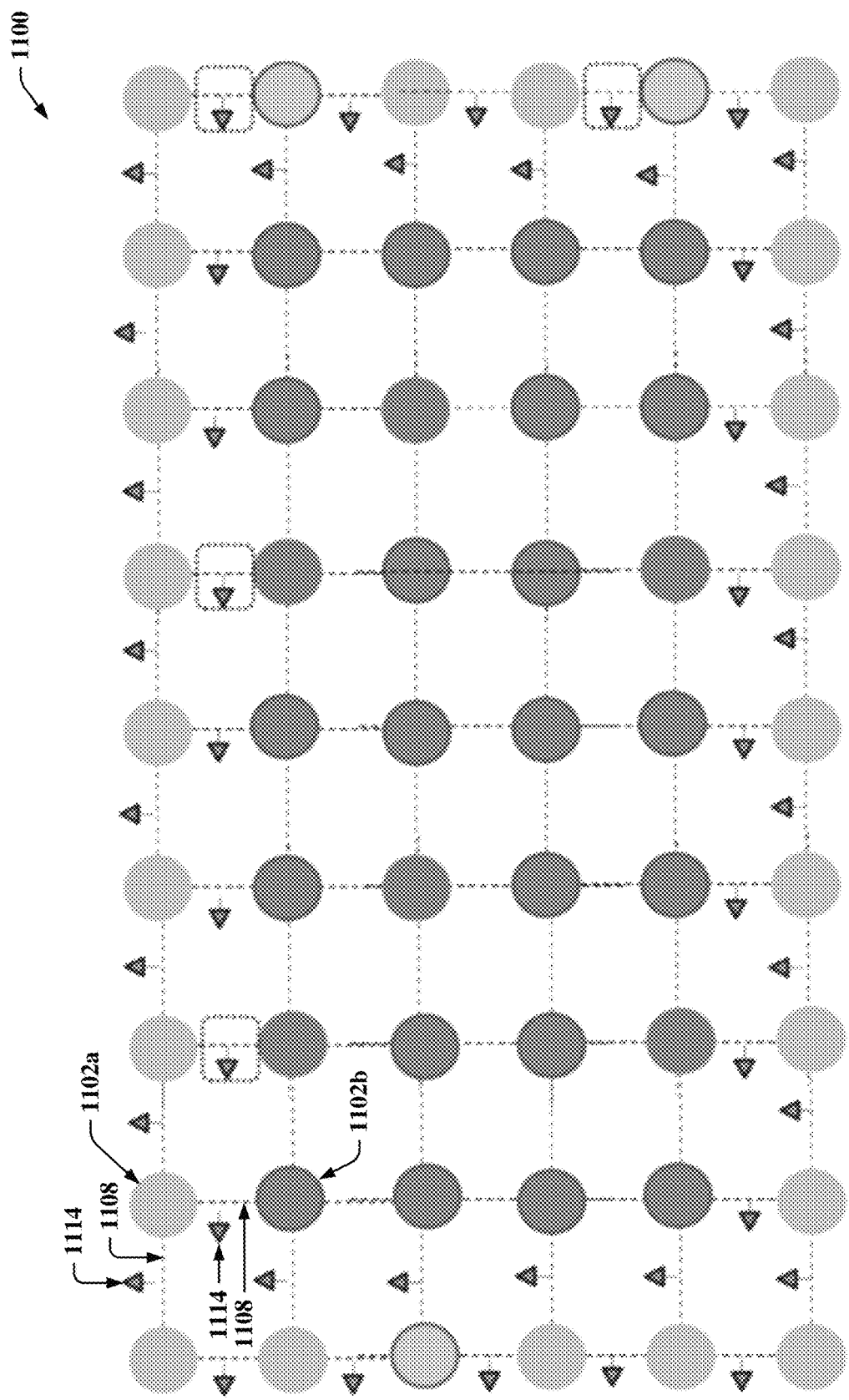

FIG. 11 illustrates a topology of an example, non-limiting device 1100 that can facilitate a programmable and/or reprogrammable quantum circuit in accordance with one or more embodiments described herein. Repetitive description of like elements and/or processes employed in respective embodiments is omitted for sake of brevity.

As illustrated in the example embodiment depicted in FIG. 11, device 1100 can be represented as a topology comprising multiple qubits (represented as varying shades of gray circles in FIG. 11) that can be coupled to one another via multiple superconducting coupler devices (represented by dashed lines in FIG. 11) that can each be coupled to a ground (represented as light gray triangles in FIG. 11). Although device 1100 can comprise multiple qubits that can be coupled to one another via multiple superconducting coupler devices that can each be coupled to a ground, for clarity, only certain elements of device 1100 are annotated in the example embodiment depicted in FIG. 11. Device 1100 can comprise an example, non-limiting alternative embodiment of device 900 described above with reference to the example embodiment depicted in FIG. 9.

Although not illustrated in the example embodiment depicted in FIG. 11, one or more superconducting coupler devices of device 1100 can comprise one or more superconducting fuse devices. In the example embodiment depicted in FIG. 11, such one or more superconducting fuse devices can each comprise the same structure and/or functionality as that of superconducting fuse device 110a, 110b, and/or 110c described above with reference to the example embodiment depicted in FIG. 1. Additionally, or alternatively, although not illustrated in the example embodiment depicted in FIG. 11, one or more superconducting coupler devices of device 1100 can further comprise one or more superconducting antifuse devices. In the example embodiment depicted in FIG. 11, such one or more superconducting antifuse devices can each comprise the same structure and/or functionality as that of superconducting antifuse device 112a, 112b, and/or 112c described above with reference to the example embodiment depicted in FIG. 1. In embodiments where one or more superconducting coupler devices of device 1100 comprise one or more superconducting fuse devices and/or one or more superconducting antifuse devices, such superconducting fuse and/or antifuse device(s) can be actuated (e.g., operated) in the same manner (e.g., via exposure to a laser) as described above with reference to the example embodiments depicted in FIGS. 1-9.

As illustrated in the example embodiment depicted in FIG. 11, device 1100 can comprise multiple (e.g., fifty-four) qubits 1102 (not annotated in FIG. 11 for clarity). Qubits 1102 can each comprise the same structure and/or functionality as that of qubit 102 described above with reference to the example embodiment depicted in FIG. 1. As illustrated in the example embodiment depicted in FIG. 11, device 1100 can comprise multiple (e.g., twenty-six) qubits 1102a of qubits 1102 that can be provided along the perimeter of the example topology representation of device 1100 depicted in FIG. 11. In this example embodiment, device 1100 can further comprise multiple (e.g., twenty-eight) qubits 1102b provided in the interior portion of the example topology representation of device 1100 depicted in FIG. 11. In the example embodiment illustrated in FIG. 11, device 1100 can further comprise multiple superconducting coupler devices 1108 (only two are annotated in FIG. 11 for clarity) that can be coupled to various qubits 1102 of device 1100. Superconducting coupler devices 1108 can each comprise the same structure and/or functionality as that of superconducting coupler device 108a, 108b, 108c, and/or 108d described above with reference to the example embodiment depicted in FIG. 1.

Although not illustrated in the example embodiment depicted in FIG. 11, superconducting coupler devices 1108 can each comprise a superconducting fuse device that can enable coupling of each superconducting coupler device 1108 to a ground 1114 of device 1100 in the same manner as superconducting fuse device 910 can enable coupling of superconducting coupler device 908 to ground 914 of device 900 described above with reference to the example embodiment depicted in FIG. 9. Additionally, or alternatively, although not illustrated in the example embodiment depicted in FIG. 11, superconducting coupler devices 1108 can each further comprise a superconducting antifuse device that can enable coupling of each superconducting coupler device 1108 to one or more qubits 1102 or to ground 1114. In the example embodiment depicted in FIG. 11, actuation (e.g., via exposure to a laser) of one or more of such superconducting fuse devices and/or one or more of such superconducting antifuse devices of superconducting coupler devices 1108 can enable device 1100 to have a topology (e.g., qubit topology) that can be initially programmed (e.g., configured) as a certain first topology and/or subsequently reprogrammed (e.g., reconfigured) to a certain second, different topology. For example, actuating (e.g., via exposure to a laser) or not actuating (e.g., via no exposure to a laser) one or more of such superconducting fuse devices and/or one or more of such superconducting antifuse devices of superconducting coupler devices 1108 can enable coupling or decoupling of one or more pairs of qubits 1102a and qubits 1102b of device 1100. It should be appreciated that actuating (e.g., via exposure to a laser) or not actuating (e.g., via no exposure to a laser) one or more of such superconducting fuse devices and/or one or more of such superconducting antifuse devices of superconducting coupler devices 1108 can enable device 1100 to provide a variety of topologies where certain qubits 1102 are coupled to define a certain topology while others are effectively isolated from the topology and/or rendered inoperable.

Figure 12:
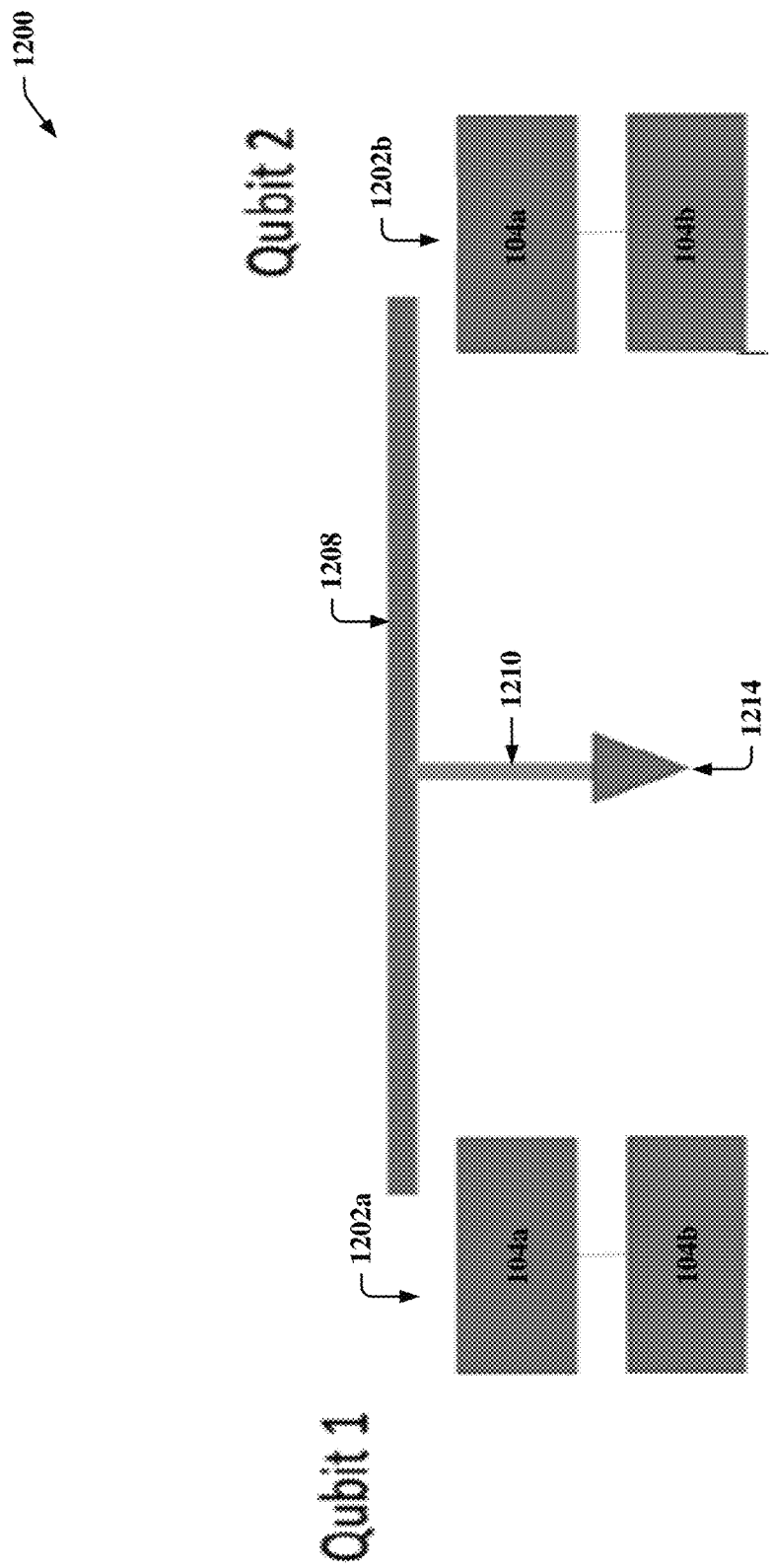

FIG. 12 illustrates an example, non-limiting device 1200 that can facilitate a programmable and/or reprogrammable quantum circuit in accordance with one or more embodiments described herein. Repetitive description of like elements and/or processes employed in respective embodiments is omitted for sake of brevity.

As illustrated in the example embodiment depicted in FIG. 12, device 1200 can comprise qubits 1202a. 1202b (denoted as "Qubit 1" and "Qubit 2," respectively, in FIG. 12) that can be coupled to one another via a superconducting coupler device 1208. Qubits 1202a, 1202b can each comprise the same structure and/or functionality as that of qubit 102 described above with reference to the example embodiment depicted in FIG. 1. Superconducting coupler device 1208 can comprise the same structure and/or functionality as that of superconducting coupler device 108a, 108b, 108c, and/or 108d described above with reference to the example embodiment depicted in FIG. 1. As illustrated in the example embodiment depicted in FIG. 12, superconducting coupler device 1208 can comprise a superconducting fuse device 1210 that can couple superconducting coupler device 1208 to a ground 1214. In this example embodiment, superconducting fuse device 1210 can be actuated (e.g., operated) to decouple superconducting coupler device 1208 from ground 1214, thereby enabling coupling of qubit 1202a to qubit 1202b.

As described above with reference to the example embodiment depicted in FIG. 1, to actuate (e.g., operate) superconducting fuse device 1210, such a device can be exposed to a laser output (e.g., exposed to a laser). In the example embodiment depicted in FIG. 12, to expose superconducting fuse device 1210 to a laser output, device 1200 and/or superconducting fuse device 1210 can be coupled to one or more of the external devices described above with reference to the example embodiment illustrated in FIG. 1. For example, device 1200 and/or superconducting fuse device 1210 can be coupled to one or more external devices (not illustrated in FIG. 12) that can be external to device 1200 such as, for instance, a laser device (e.g., a power amplifier, an optical laser device, and/or an infrared laser device), a pulse generator device (e.g., an AWG and/or a VNA), and/or a computer (e.g., computer 1512) that can be employed to operate and/or control such a laser device and/or pulse generator device (e.g., via processing unit 1514 executing instructions stored on system memory 1516). In this example, such a computer can be employed to enable the laser device and/or the pulse generator device to respectively: a) transmit and/or receive a laser of optical and/or infrared light to and/or from device 1200 and/or superconducting fuse device 1210; and/or b) transmit and/or receive pulses (e.g., microwave pulses, microwave signals, control signals, and/or another pulse) to and/or from device 1200 and/or superconducting fuse device 1210. In this example, such a laser of optical and/or infrared light can constitute a laser output that can be provided to, for instance, device 1200 and/or superconducting fuse device 1210.

In the example embodiment illustrated in FIG. 12, based on exposure of superconducting fuse device 1210 to a laser output, superconducting fuse device 1210 can break an electrically conductive path between superconducting coupler device 1208 and ground 1214 to decouple superconducting coupler device 1208 from ground 1214. In this example embodiment, based on decoupling superconducting coupler device 1208 from ground 1214, superconducting coupler device 1208 can be coupled to qubit 1202a (e.g., to capacitor pad 104a of qubit 1202a) and qubit 1202b (e.g., to capacitor pad 104a of qubit 1202b).

Figure 13:
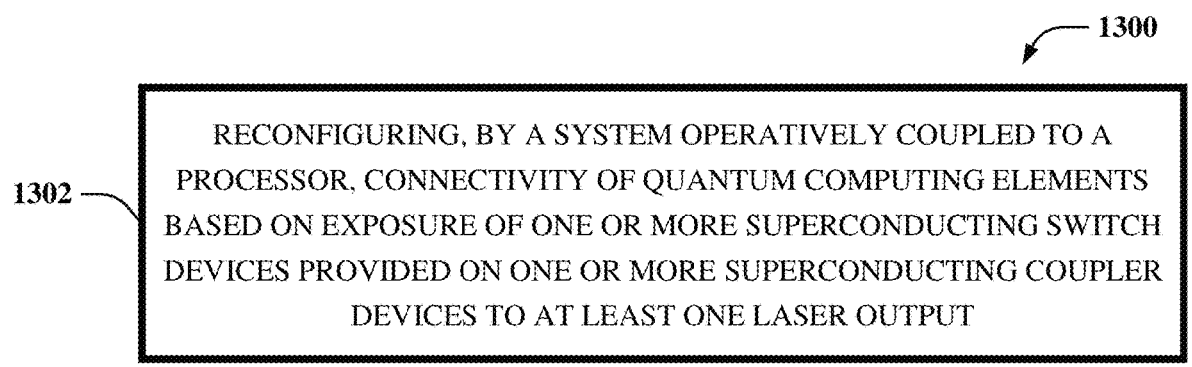
FIGS. 13 and 14 illustrate flow diagrams of example, non-limiting computer-implemented methods that can facilitate a programmable and/or reprogrammable quantum circuit in accordance with one or more embodiments described herein.

FIG. 13 illustrates a flow diagram of an example, non-limiting computer-implemented method 1300 that can facilitate a programmable and/or reprogrammable quantum circuit in accordance with one or more embodiments described herein. Repetitive description of like elements and/or processes employed in respective embodiments is omitted for sake of brevity.

At 1302, computer-implemented method 1300 can comprise reconfiguring, by a system (e.g., a system comprising, for instance, device 100 coupled to a power amplifier, an optical laser device, an infrared laser device, an AWG, and/or a VNA that can be coupled to computer 1512) operatively coupled to a processor (e.g., processing unit 1514), connectivity of quantum computing elements based on exposure of one or more superconducting switch devices (e.g., one or more superconducting fuse devices 110a, 110b, 110c and/or one or more superconducting antifuse devices 112a. 112b, 112c) provided on one or more superconducting coupler devices (e.g., one or more superconducting coupler devices 108a, 108b, 108c, 108d) to at least one laser output. For example, with reference to the example embodiment illustrated in FIG. 1, based on exposure of one or more superconducting fuse devices 110a, 110b, 110c and/or one or more superconducting antifuse devices 112a, 112b, 112c to at least one laser output (e.g., at least one laser generated by a laser device), connectivity (e.g., coupling) of qubit 102 with one or more quantum computing elements (e.g., another qubit, a readout device, a transmission line, a bus, a resonator, and/or another quantum computing element) can be reconfigured (e.g., reprogrammed).

Figure 14:
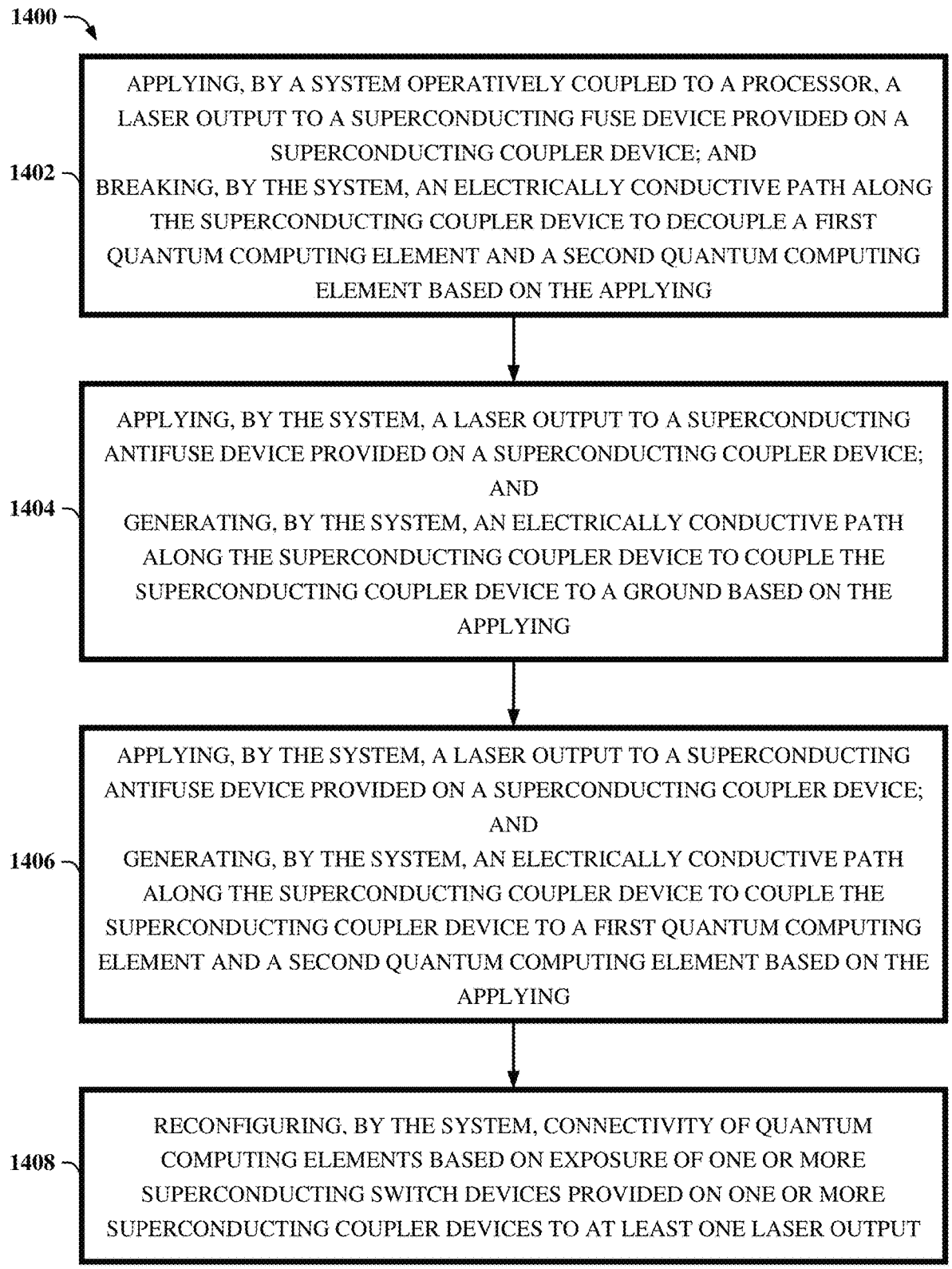

FIG. 14 illustrates a flow diagram of an example, non-limiting computer-implemented method 1400 that can facilitate a programmable and/or reprogrammable quantum circuit in accordance with one or more embodiments described herein. Repetitive description of like elements and/or processes employed in respective embodiments is omitted for sake of brevity.

At 1402, computer-implemented method 1400 can comprise applying, by a system (e.g., a system comprising, for instance, device 100 coupled to a power amplifier, an optical laser device, an infrared laser device, an AWG, and/or a VNA that can be coupled to computer 1512) operatively coupled to a processor (e.g., processing unit 1514), a laser output (e.g., a first laser output) to a superconducting fuse device (e.g., superconducting fuse device 110a) provided on a superconducting coupler device (e.g., superconducting coupler device 108a); and breaking, by the system, an electrically conductive path along the superconducting coupler device to decouple a first quantum computing element (e.g., qubit 102 and/or capacitor pad 104a of qubit 102) and a second quantum computing element (e.g., a quantum computing element external to device 100 such as, for instance, a qubit) based on the applying (e.g., based on exposure of superconducting fuse device 110a to a first laser output).

At 1404, computer-implemented method 1400 can comprise applying, by the system (e.g., a system comprising, for instance, device 100 coupled to a power amplifier, an optical laser device, an infrared laser device, an AWG, and/or a VNA that can be coupled to computer 1512) operatively coupled to a processor (e.g., processing unit 1514), a laser output (e.g., a second laser output) to a superconducting antifuse device (e.g., superconducting antifuse device 112a) provided on a superconducting coupler device (e.g., superconducting coupler device 108a); and generating, by the system, an electrically conductive path along the superconducting coupler device to couple the superconducting coupler device to a ground based on the applying (e.g., based on exposure of superconducting antifuse device 112a to a second laser output).

At 1406, computer-implemented method 1400 can comprise applying, by the system (e.g., a system comprising, for instance, device 100 coupled to a power amplifier, an optical laser device, an infrared laser device, an AWG, and/or a VNA that can be coupled to computer 1512) operatively coupled to a processor (e.g., processing unit 1514), a laser output (e.g., a third laser output) to a superconducting antifuse device (e.g., superconducting antifuse device 112b) provided on a superconducting coupler device (e.g., superconducting coupler device 108b); and generating, by the system, an electrically conductive path along the superconducting coupler device to couple the superconducting coupler device to a first quantum computing element (e.g., qubit 102 and/or capacitor pad 104a of qubit 102) and a second quantum computing element (e.g., a quantum computing element external to device 100 such as, for instance, a readout device) based on the applying (e.g., based on exposure of superconducting antifuse device 112b to a third laser output).

At 1408, computer-implemented method 1400 can comprise reconfiguring, by the system (e.g., a system comprising, for instance, device 100 coupled to a power amplifier, an optical laser device, an infrared laser device, an AWG, and/or a VNA that can be coupled to computer 1512), connectivity (e.g., coupling) of quantum computing elements based on exposure of one or more superconducting switch devices (e.g., one or more superconducting fuse devices 110a, 110b, 110c and/or one or more superconducting antifuse devices 112a, 112b, 112c) provided on one or more superconducting coupler devices (e.g., one or more superconducting coupler devices 108a, 108b, 108c, 108d) to at least one laser output. For example, with reference to the example embodiment illustrated in FIG. 1, based on exposure of one or more superconducting fuse devices 110a, 110b, 110c and/or one or more superconducting antifuse devices 112a, 112b, 112c to at least one laser output (e.g., at least one laser generated by a laser device), connectivity of qubit 102 with one or more quantum computing elements (e.g., another qubit, a readout device, a transmission line, a bus, a resonator, and/or another quantum computing element) can be reconfigured (e.g., reprogrammed).

The various embodiments of the subject disclosure (e.g., devices 100, 200, 300, 400, 500, 600a, 600b, 700, 800, 900, 1000a, 1000b, 1000c, 1100, and/or 1200) can be associated with various technologies. For example, the various embodiments of the subject disclosure can be associated with quantum computing technologies, qubit device technologies, quantum hardware and/or software technologies, quantum circuit technologies, superconducting circuit technologies, quantum circuit and/or superconducting circuit topology technologies, machine learning technologies, artificial intelligence technologies, cloud computing technologies, and/or other technologies.

The various embodiments of the subject disclosure (e.g., devices 100, 200, 300, 400, 500, 600a, 600b, 700, 800, 900, 1000a, 1000b, 1000c, 1100, and/or 1200) can provide technical improvements to systems, devices, components, operational steps, and/or processing steps associated with the various technologies identified above. For example, the various embodiments of the subject disclosure can provide a programmable and/or a reprogrammable quantum circuit, where based on one or more performance criteria (e.g., frequency collisions, poor quality factor (Q) of a qubit related to its coherence, fidelity, accuracy, efficiency, and/or another performance criteria) the connectivity (e.g., coupling) of one or more quantum computing elements in such a quantum circuit can be configured and/or reconfigured to achieve one or more defined criteria.

The various embodiments of the subject disclosure (e.g., devices 100, 200, 300, 400, 500, 600a, 600b, 700, 800, 900, 1000a, 1000b, 1000c, 1100, and/or 1200) can provide technical improvements to a processing unit (e.g., a quantum processor comprising the various embodiments of the subject disclosure) that can be associated with the various embodiments of the subject disclosure. For example, as described above, the various embodiments of the subject disclosure can provide a programmable and/or a reprogrammable quantum circuit, where based on one or more performance criteria (e.g., frequency collisions, poor quality factor (Q) of a qubit related to its coherence, fidelity, accuracy, efficiency, and/or another performance criteria) the connectivity (e.g., coupling) of one or more quantum computing elements in such a quantum circuit can be configured and/or reconfigured to achieve one or more defined criteria. In this example, one or more of the embodiments of the subject disclosure can be implemented in a processor such as, for instance, a quantum processor. In this example, as such one or more embodiments of the subject disclosure that can be implemented into such a quantum processor can provide a programmable and/or reprogrammable quantum circuit that can be modified to improve one or more performance criteria of such a quantum circuit, such one or more embodiments of the subject disclosure can thereby improve one or more performance criteria (e.g., accuracy, fidelity, and/or another performance criterion) of such a quantum processor comprising one or more of the various embodiments of the subject disclosure.

Based on providing the above described programmable and/or reprogrammable quantum circuit, a practical application of the various embodiments of the subject disclosure (e.g., devices 100, 200, 300, 400, 500, 600a, 600b, 700, 800, 900, 1000a, 1000b, 1000c, 1100, and/or 1200) is that they can be implemented in a quantum device (e.g., a quantum processor, a quantum computer, and/or another quantum device) to enable it to more quickly and more efficiently compute, with improved fidelity and/or accuracy, one or more solutions (e.g., heuristic(s)) to a variety of problems ranging in complexity (e.g., an estimation problem, an optimization problem, and/or another problem) in a variety of domains (e.g., finance, chemistry, medicine, and/or another domain). For example, based on providing the above described programmable and/or reprogrammable quantum circuit, a practical application of the various embodiments of the subject disclosure is that they can be implemented in, for instance, a quantum processor to enable it to more quickly and more efficiently compute, with improved fidelity and/or accuracy, one or more solutions (e.g., heuristic(s)) to an optimization problem in the domain of chemistry, medicine, and/or finance, where such a solution can be used to engineer, for instance, a new chemical compound, a new medication, and/or a new options pricing system and/or method.

It should be appreciated that the various embodiments of the subject disclosure (e.g., devices 100, 200, 300, 400, 500, 600*a*, 600*b*, 700, 800, 900, 1000*a*, 1000*b*, 1000*c*, 1100, and/or 1200) provide a new approach driven by relatively new quantum computing technologies. For example, the various embodiments of the subject disclosure provide a new approach to program and/or reprogram (e.g., configure and/or reconfigure) connectivity (e.g., coupling) of one or more quantum computing elements of a quantum circuit. In this example, such a new approach to provide a programmable and/or reprogrammable quantum circuit can enable faster and more efficient quantum computations with improved accuracy using a quantum processor comprising one or more of the various embodiments of the subject disclosure.

The various embodiments of the subject disclosure (e.g., devices 100, 200, 300, 400, 500, 600*a*, 600*b*, 700, 800, 900, 1000*a*, 1000*b*, 1000*c*, 1100, and/or 1200) can employ hardware and/or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, and/or another specialized computer) to execute defined tasks related to the various technologies identified above. The various embodiments of the subject disclosure can be employed to solve new problems that arise through advancements in technologies mentioned above, employment of quantum computing systems, cloud computing systems, computer architecture, and/or another technology.

It is to be appreciated that the various embodiments of the subject disclosure (e.g., devices 100, 200, 300, 400, 500, 600*a*, 600*b*, 700, 800, 900, 1000*a*, 1000*b*, 1000*c*, 1100, and/or 1200) can utilize various combinations of electrical components, mechanical components, and circuitry that cannot be replicated in the mind of a human or performed by a human, as the various operations that can be executed by the various embodiments of the subject disclosure are operations that are greater than the capability of a human mind. For instance, the amount of data processed, the speed of processing such data, or the types of data processed by the various embodiments of the subject disclosure over a certain period of time can be greater, faster, or different than the amount, speed, or data type that can be processed by a human mind over the same period of time.

According to several embodiments, the various embodiments of the subject disclosure (e.g., devices 100, 200, 300, 400, 500, 600*a*, 600*b*, 700, 800, 900, 1000*a*, 1000*b*, 1000*c*, 1100, and/or 1200) can also be fully operational towards performing one or more other functions (e.g., fully powered on, fully executed, and/or another function) while also performing the various operations described herein. It should be appreciated that such simultaneous multi-operational execution is beyond the capability of a human mind. It should also be appreciated that the various embodiments of the subject disclosure can include information that is impossible to obtain manually by an entity, such as a human user. For example, the type, amount, and/or variety of information included in the various embodiments of the subject disclosure can be more complex than information obtained manually by a human user.

Figure 15:
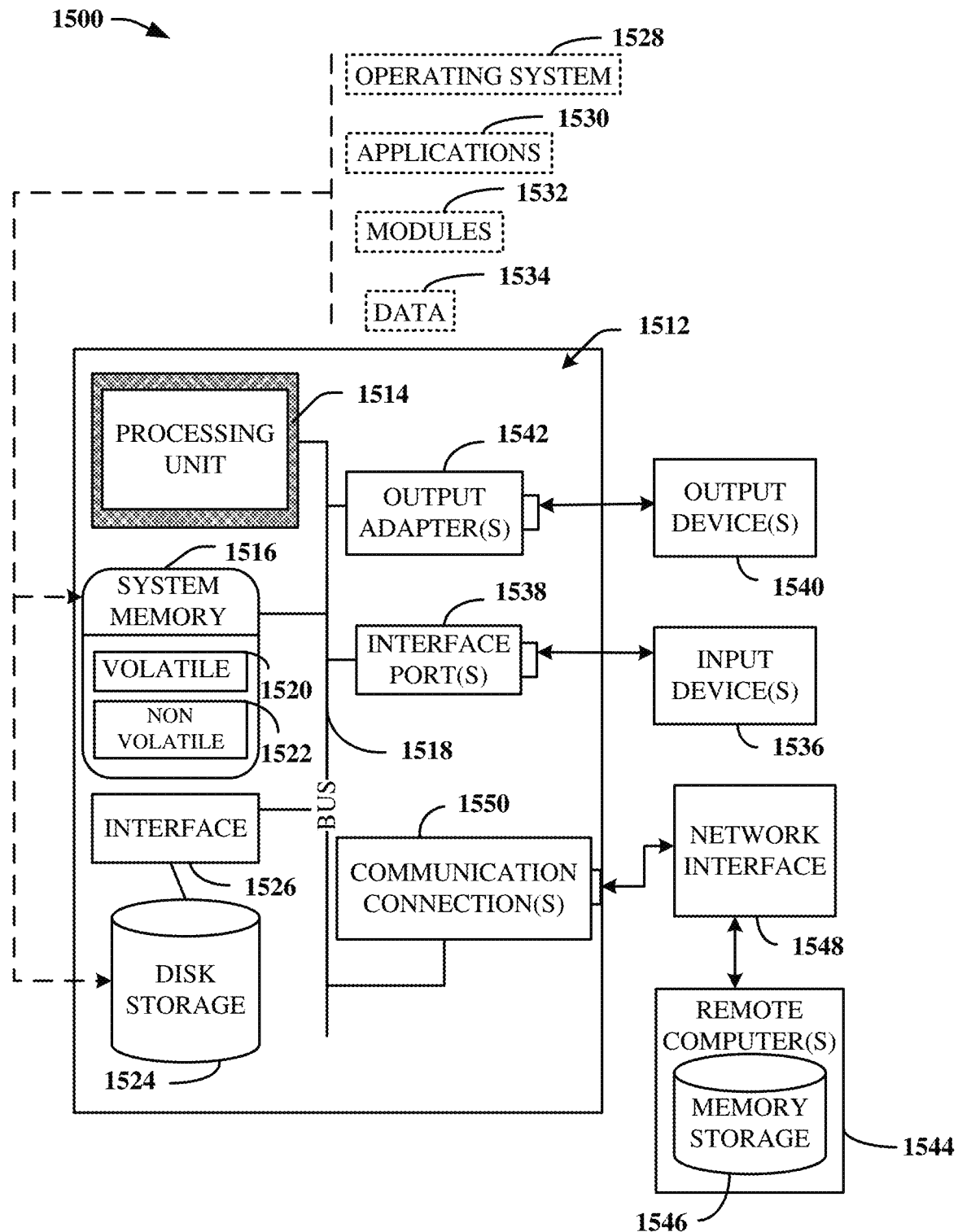
FIG. 15 illustrates a block diagram of an example, non-limiting operating environment in which one or more embodiments described herein can be facilitated.

In order to provide a context for the various aspects of the disclosed subject matter, FIG. 15 as well as the following discussion are intended to provide a general description of a suitable environment in which the various aspects of the disclosed subject matter can be implemented. FIG. 15 illustrates a block diagram of an example, non-limiting operating environment in which one or more embodiments described herein can be facilitated. For example, as described below, operating environment 1500 can be used to implement the example, non-limiting multi-step fabrication sequences described above with reference to FIGS. 1-12 that can be implemented to fabricate the various embodiments of the subject disclosure described herein. In another example, as described below, operating environment 1500 can be used to implement one or more of the example, non-limiting computer-implemented methods 1300 and/or 1400 described above with reference to FIGS. 13 and 14, respectively. Repetitive description of like elements and/or processes employed in other embodiments described herein is omitted for sake of brevity.

The example, non-limiting multi-step fabrication sequences described above with reference to FIGS. 1-12, which can be implemented to fabricate the various embodiments of the subject disclosure, can be implemented by a computing system (e.g., operating environment 1500 illustrated in FIG. 15 and described below) and/or a computing device (e.g., computer 1512 illustrated in FIG. 15 and described below). In non-limiting example embodiments, such a computing system (e.g., operating environment 1500) and/or such a computing device (e.g., computer 1512) can comprise one or more processors and one or more memory devices that can store executable instructions thereon that, when executed by the one or more processors, can facilitate performance of the example, non-limiting multi-step fabrication sequences described above with reference to FIGS. 1-12. As a non-limiting example, the one or more processors can facilitate performance of the example, non-limiting multi-step fabrication sequences described above with reference to FIGS. 1-12 by directing and/or controlling one or more systems and/or equipment operable to perform semiconductor and/or superconductor device fabrication.

In another example, one or more of the example, non-limiting computer-implemented methods 1300 and/or 1400 described above with reference to FIGS. 13 and 14, respectively, can also be implemented (e.g., executed) by operating environment 1500. As a non-limiting example, the one or more processors of such a computing device (e.g., computer 1512) can facilitate performance of one or more of the example, non-limiting computer implemented methods 1300 and/or 1400 described above with reference to FIGS. 13 and 14, respectively, by directing and/or controlling one or more systems and/or equipment (e.g., one or more types of the external device defined herein such as, for instance, a power amplifier, an optical laser device, an infrared laser device, an AWG, a VNA, and/or another external device)

operable to perform the operations and/or routines of such computer-implemented method(s).

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

With reference to FIG. 15, a suitable operating environment 1500 to implement various aspects of this disclosure can also include a computer 1512. The computer 1512 can also include a processing unit 1514, a system memory 1516, and a system bus 1518. The system bus 1518 couples system components including, but not limited to, the system memory 1516 to the processing unit 1514. The processing unit 1514 can be any of various available processors. Dual microprocessors and other multiprocessor architectures also can be employed as the processing unit 1514. The system bus 1518 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1516 can also include volatile memory 1520 and nonvolatile memory 1522. The basic input/output system (BIOS), containing the basic routines to transfer information between elements within the computer 1512, such as during start-up, is stored in nonvolatile memory 1522. Computer 1512 can also include removable/non-removable, volatile/non-volatile computer storage media. FIG. 15 illustrates, for example, a disk storage 1524. Disk storage 1524 can also include, but is not limited to, devices like a magnetic disk drive, floppy disk drive, tape drive, Jaz drive, Zip drive, LS-100 drive, flash memory card, or memory stick. The disk storage 1524 also can include storage media separately or in combination with other storage media. To facilitate connection of the disk storage 1524 to the system bus 1518, a removable or non-removable interface is typically used, such as interface 1526. FIG. 15 also depicts software that acts as an intermediary between users and the basic computer resources described in the suitable operating environment 1500. Such software can also include, for example, an operating system 1528. Operating system 1528, which can be stored on disk storage 1524, acts to control and allocate resources of the computer 1512.

System applications 1530 take advantage of the management of resources by operating system 1528 through program modules 1532 and program data 1534, e.g., stored either in system memory 1516 or on disk storage 1524. It is to be appreciated that this disclosure can be implemented with various operating systems or combinations of operating systems. A user enters commands or information into the computer 1512 through input device(s) 1536. Input devices 1536 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1514 through the system bus 1518 via interface port(s) 1538. Interface port(s) 1538 include, for example, a serial port, a parallel port, a game port, and a universal serial bus (USB). Output device(s) 1540 use some of the same type of ports as input device(s) 1536. Thus, for example, a USB port can be used to provide input to computer 1512, and to output information from computer 1512 to an output device 1540. Output adapter 1542 is provided to illustrate that there are some output devices 1540 like monitors, speakers, and printers, among other output devices 1540, which require special adapters. The output adapters 1542 include, by way of illustration and not limitation, video and sound cards that provide a means of connection between the output device 1540 and the system bus 1518. It should be noted that other devices and/or systems of devices provide both input and output capabilities such as remote computer(s) 1544.

Computer 1512 can operate in a networked environment using logical connections to one or more remote computers, such as remote computer(s) 1544. The remote computer(s) 1544 can be a computer, a server, a router, a network PC, a workstation, a microprocessor based appliance, a peer device or other common network node and the like, and typically can also include many or all of the elements described relative to computer 1512. For purposes of brevity, only a memory storage device 1546 is illustrated with remote computer(s) 1544. Remote computer(s) 1544 is logically connected to computer 1512 through a network interface 1548 and then physically connected via communication connection 1550. Network interface 1548 encompasses wire and/or wireless communication networks such as local-area networks (LAN), wide-area networks (WAN), cellular networks, and/or another communication network. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection (s) 1550 refers to the hardware/software employed to connect the network interface 1548 to the system bus 1518. While communication connection 1550 is shown for illustrative clarity inside computer 1512, it can also be external to computer 1512. The hardware/software for connection to the network interface 1548 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, and/or entities that perform particular tasks and/or implement particular abstract data types. Moreover, those skilled in the art will appreciate that the inventive computer-implemented methods can be practiced with other computer system configurations, including single-processor or multi-processor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, where the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store." "storage," "data store," data storage," "database," and substantially any other information storage component relevant to operation and functionality of a component are utilized to refer to "memory components," entities embodied in a "memory." or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a superconducting coupler device having a superconducting antifuse device that is used to alter coupling of a first quantum computing element and a second quantum computing element to enable removal of one or more problematic qubits from a quantum circuit and facilitate a programmable or reprogrammable qubit circuit.

2. The device of claim 1, wherein the superconducting antifuse device generates an electrically conductive path along the superconducting coupler device based on exposure of the superconducting antifuse device to a laser output, and wherein the superconducting antifuse device couples the first quantum computing element and the second quantum computing element based on generation of the electrically conductive path to improve at least one of: performance, accuracy, fidelity, or efficiency of a quantum computing device comprising the device.

3. The device of claim 1, further comprising:
   a second superconducting coupler device having a second superconducting antifuse device that couples the first quantum computing element and a third quantum computing element based on exposure of the second superconducting antifuse device to a laser output.

4. The device of claim 1, further comprising a second superconducting coupler device having:
   a superconducting fuse device that decouples the first quantum computing element and a third quantum computing element based on exposure of the superconducting fuse device to a laser output; and
   a second superconducting antifuse device that connects the second superconducting coupler device to a ground based on exposure of the second superconducting antifuse device to a second laser output.

5. The device of claim 1, wherein the superconducting coupler device is selected from a group consisting of a quantum resonator, a bus, a transmission line, an electrode, or a lead.

6. The device of claim 1, wherein at least one of the first quantum computing element or the second quantum computing element is selected from a group consisting of a qubit, a qubit device, a quantum computing device, a readout device, a second quantum resonator, a waveguide, a Josephson junction, a ground, a capacitor, or a shunt capacitor.

7. A method, comprising:
   employing a superconducting antifuse device to alter coupling of a first quantum computing element and a second quantum computing element of a superconducting coupler device; and further employing a superconducting fuse device to decouple the first quantum computing element and a third quantum computing element based on exposure of the superconducting fuse device to a laser output; and
   employing a second superconducting antifuse device to connect a second superconducting coupler device to a ground based on exposure of the second superconducting antifuse device to a second laser output.

8. The method of claim 7, further comprising exposing the superconducting antifuse device to a laser output to generate an electrically conductive path along the superconducting coupler device, wherein the superconducting antifuse device couples the first quantum computing element and the second quantum computing element to improve at least one of: performance, accuracy, fidelity, or efficiency of a quantum computing device comprising the superconducting coupler device.

9. The method of claim 7, further comprising:
   employing a laser output on a second superconducting antifuse device to couple the first quantum computing element and a third quantum computing element.

10. The method of claim 7, further comprising selecting the superconducting coupler device from a group consisting of: a quantum resonator, a bus, a transmission line, an electrode, or a lead.

11. The method of claim 7, further comprising selecting at least one of the first quantum computing element or the second quantum computing element from a group consisting of a qubit, a qubit device, a quantum computing device, a readout device, a second quantum resonator, a waveguide, a Josephson junction, a ground, a capacitor, or a shunt capacitor.

12. A device, comprising:
    a superconducting antifuse device that based on exposure to a laser alters coupling of a first quantum computing element and a second quantum computing element of a superconducting coupler device, wherein the superconducting antifuse device generates an electrically conductive path along the superconducting coupler device; and further comprising a second superconducting coupler device having:
    a superconducting fuse device that decouples the first quantum computing element and a third quantum computing element based on exposure of the superconducting fuse device to the laser; and
    a second superconducting antifuse device that connects the second superconducting coupler device to a ground based on exposure of the second superconducting antifuse device to the laser.

13. The device of claim 12, further comprising:
    a second superconducting coupler device having a second superconducting antifuse device that couples the first quantum computing element and a third quantum computing element based on exposure of the second superconducting anti fuse device to the laser.

14. The device of claim 12, wherein the superconducting coupler device is a quantum resonator.

15. The device of claim 12, wherein the superconducting coupler device is selected from the group consisting of: a quantum resonator, a bus, a transmission line, an electrode, or a lead.

16. The device of claim 12, wherein at least one of the first quantum computing element or the second quantum computing element is selected from a group consisting of a qubit, a qubit device, a quantum computing device, a readout device, a second quantum resonator, a waveguide, a Josephson junction, a ground, a capacitor, or a shunt capacitor.

17. The device of claim 12, wherein at least one of the first quantum computing element or the second quantum computing element is a qubit device.

18. The device of claim 12, wherein at least one of the first quantum computing element or the second quantum computing element is a quantum resonator.

\* \* \* \* \*